(12) United States Patent
Ogawa et al.

(10) Patent No.: US 12,189,267 B2
(45) Date of Patent: Jan. 7, 2025

(54) REFLECTIVE OPTICAL DEVICE

(71) Applicant: Mitsubishi Electric Corporation, Tokyo (JP)

(72) Inventors: Shimpei Ogawa, Tokyo (JP); Masaaki Shimatani, Tokyo (JP); Shoichiro Fukushima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 590 days.

(21) Appl. No.: 17/605,239

(22) PCT Filed: Jun. 20, 2019

(86) PCT No.: PCT/JP2019/024588
§ 371 (c)(1),
(2) Date: Oct. 21, 2021

(87) PCT Pub. No.: WO2020/255357
PCT Pub. Date: Dec. 24, 2020

(65) Prior Publication Data
US 2022/0197107 A1    Jun. 23, 2022

(51) Int. Cl.
*G02F 1/31*    (2006.01)
(52) U.S. Cl.
CPC .................... *G02F 1/31* (2013.01)
(58) Field of Classification Search
CPC ........ G02F 1/31; G02F 1/0063; G02F 1/1335; G02F 1/33555; G02F 1/1336; G02F 1/1343; G02F 1/34309; G02F 1/13439
See application file for complete search history.

(56) References Cited

U.S. PATENT DOCUMENTS

| | | | | |
|---|---|---|---|---|
| 7,009,752 B1* | 3/2006 | Lorell | ............ | G02B 7/1821 |
| | | | | 359/290 |
| 7,898,789 B1* | 3/2011 | Jarvinen | ............ | B64U 30/10 |
| | | | | 361/218 |
| 2002/0007687 A1* | 1/2002 | Zimmermann | ...... | G01N 1/02 |
| | | | | 73/864.71 |

(Continued)

FOREIGN PATENT DOCUMENTS

| | | |
|---|---|---|
| JP | 2018-509643 A | 4/2018 |
| WO | 2016/126896 A1 | 8/2016 |

OTHER PUBLICATIONS

Wang et al., "General Laws of Reflection and Refraction for Subwavelength Phase Grating", arXiv:1312.3855, Research Gate, Dec. 2013, pp. 1-12.

(Continued)

*Primary Examiner* — Christopher Stanford
*Assistant Examiner* — Journey F Sumlar
(74) *Attorney, Agent, or Firm* — XSENSUS LLP

(57) ABSTRACT

A reflective optical device has an insulation layer, a lattice group, a rear surface electrode, and a voltage application unit. Lattice group is composed of a plurality of lattices including a lattice and a lattice. Each of the plurality of lattices has a structure in which dielectric layer and graphene layer are laminated. Voltage application unit has a function of individually applying a voltage to each of lattice group. Voltage application unit includes a voltage application unit to apply a first voltage to lattice, and a voltage application unit to apply a second voltage to lattice.

17 Claims, 19 Drawing Sheets

(56) References Cited

U.S. PATENT DOCUMENTS

2016/0223723 A1    8/2016    Han et al.
2017/0153527 A1    6/2017    Kim et al.
2018/0062341 A1    3/2018    Kim et al.
2018/0120595 A1*  5/2018    Joo ........................ G02F 1/19

OTHER PUBLICATIONS

Soavi et al., "Broadband, Electrically Tuneable, Third Harmonic Generation in Graphene", arXiv:1710.03694v1, Oct. 6, 2017, pp. 1-14.

International Search Report and Written Opinion mailed on Sep. 17, 2019, received for PCT Application PCT/JP2019/024588, Filed on Jun. 20, 2019, 10 pages including English Translation.

Decision of Refusal mailed on Jun. 30, 2020, received for JP Application 2019-566975, 10 pages including English Translation.

Notice of Reasons for Refusal mailed on Feb. 4, 2020, received for JP Application 2019-566975, 10 pages Including English Translation.

\* cited by examiner

REFLECTIVE OPTICAL DEVICE

CROSS-REFERENCE TO RELATED APPLICATION

The present application is based on PCT filing PCT/JP2019/024588, filed Jun. 20, 2019, the entire contents of which are incorporated herein by reference.

TECHNICAL FIELD

The present invention relates to a reflective optical device.

BACKGROUND ART

Light Detection and Ranging (LiDAR) is one of remote sensing technologies, and in LiDAR, distance is measured by applying a laser beam to an object, and detecting the reflected light by a detector. LiDAR becomes more important in applications such as in Advanced Driver Assistance System (ADAS) and distance measurement in recent years as the efforts for automated driving of automobiles are advanced.

LiDAR is mainly constituted by a laser light source, a mechanically driven mirror, and a detector. The mechanically driven mirror has the problem of low operation speed, and a narrow range of reflection angle. Furthermore, the detector is required separately from the mirror, so that the problem of upsizing of the system arises. In light of this, a technique not using a mechanically driven mirror has been proposed. For example, in PTL 1, an optical modulation element having a metal-insulator-metal (MIM) structure is proposed. In the optical modulation element, the reflection angle of the reflected light is varied by modulating the refractive index by applying voltage on the insulating film, and topologically controlling the phase of the light to be reflected.

CITATION LIST

Patent Literature

PTL 1: National Patent Publication No. 2018-509643

Non Patent Literature

NPL 1: Zhaona Wang, Yanyan Sun, Lu Han, Dahe Liu "General laws of reflection and refraction for subwavelength phase grating", arXiv:1312.3855.

SUMMARY OF THE INVENTION

Technical Problem

In an optical modulation element having a metal-insulator-metal (MIM) structure, high order diffracted light is more likely to be generated owing to the structure of the insulator. This may result in deterioration in the intensity of the reflected light.

The present invention was devised to solve such problems, and it is an object of the present invention to provide a reflective optical device capable of varying the reflection angle of the reflected light without weakening the intensity of the reflected light.

Solution to Problem

The reflective optical device according to the present invention is a reflective optical device capable of varying a reflection direction of an incoming electromagnetic wave, and has an insulator, a laminated structure part, an electrode part, and a reflective plate. The insulator has a first principal plane and a second principal plane that are opposite to each other. The laminated structure part is disposed on the side of the first principal plane with respect to the insulator. The electrode part is electrically connected with the laminated structure part, and voltage is applied to the electrode part. The reflective plate is disposed on the side of the second principal plane with respect to the insulator. The laminated structure part has a plurality of laminated structures including at least one first laminated structure and at least one second laminated structure. The first laminated structure has a first width in a first direction, and extends in a second direction that intersects with the first direction. The second laminated structure is distanced from the first laminated structure in the first direction, has a second width in the first direction, and extends in the second direction. In each of the plurality of laminated structures, a dielectric layer and a first two-dimensional material layer are laminated. The electrode part has a plurality of electrodes including a first electrode and a second electrode. The first electrode is electrically connected with the first two-dimensional material layer in the first laminated structure, and a first voltage is applied to the first electrode. The second electrode is electrically connected with the first two-dimensional material layer in the second laminated structure, and a second voltage is applied to the second electrode.

Advantageous Effects of Invention

According to the reflective optical device of the present invention, the first laminated structure and the second laminated structure are distanced from each other. The first voltage is applied to the first two-dimensional material layer in the first laminated structure, and the second voltage is applied to the first two-dimensional material layer in the second laminated structure. Thus, the refractive index of the first two-dimensional material layer in each of the first laminated structure and the second laminated structure varies without weakening of the intensity of the electromagnetic wave to be reflected due to generation of diffracted light, and the phase of the electromagnetic wave to be reflected in each of the first laminated structure and the second laminated structure varies, and thus the reflection angle of the electromagnetic wave can be varied.

DESCRIPTION OF EMBODIMENTS

First, description is made for a basic structure of a reflective optical device according to each embodiment, and the principal of reflection. While the description is made by using visible light or infrared light (infrared ray), the reflective optical device is also effective as a detector of radio waves of the regions, for example, X-ray, ultraviolet light, far-red light, terahertz (THz) wave, and microwave in addition to the visible light and infrared light. In the present description, such lights and radio waves are generally referred to as electromagnetic waves.

In the description for the reflective optical device, a graphene layer is used as one of the two-dimensional material layer, and variations of the two-dimensional material layer will be described later.

The reflective optical device utilizes a resonance phenomenon to reflect electromagnetic waves. As a resonance phenomenon, a plasmon resonance phenomenon, a spoof surface plasmon resonance phenomenon, and a phenomenon by a meta material or a plasmonic meta material are known. These resonance phenomena are not distinguished from each other according to the name, but are treated equally from the view point of the effect exerted by the phenomenon. These phenomena are called a surface plasmon resonance, a plasmon resonance, or simply a resonance.

The plasmon resonance phenomenon refers to, for example, a surface plasmon resonance phenomenon that is interaction between a metal surface and light. The spoof surface plasmon resonance phenomenon refers to a resonance phenomenon in relation to electromagnetic waves especially having wavelengths near terahertz other than visible light and infrared light. The phenomenon by a meta material or a plasmonic meta material refers to a resonance phenomenon caused by manipulating an electromagnetic wave of a specific wavelength by a structure having a size less than or equal to the wavelength of the electromagnetic wave.

Further, while the reflective optical device is described by using a structure having an electromagnetic wave detection unit having a source electrode and a drain electrode, and a structure in which a reflective plate is employed as a back gate, the present invention is also applicable to a reflective optical device having an electrode structure such as a four-terminal electrode structure or a top gate structure.

Figure 1:
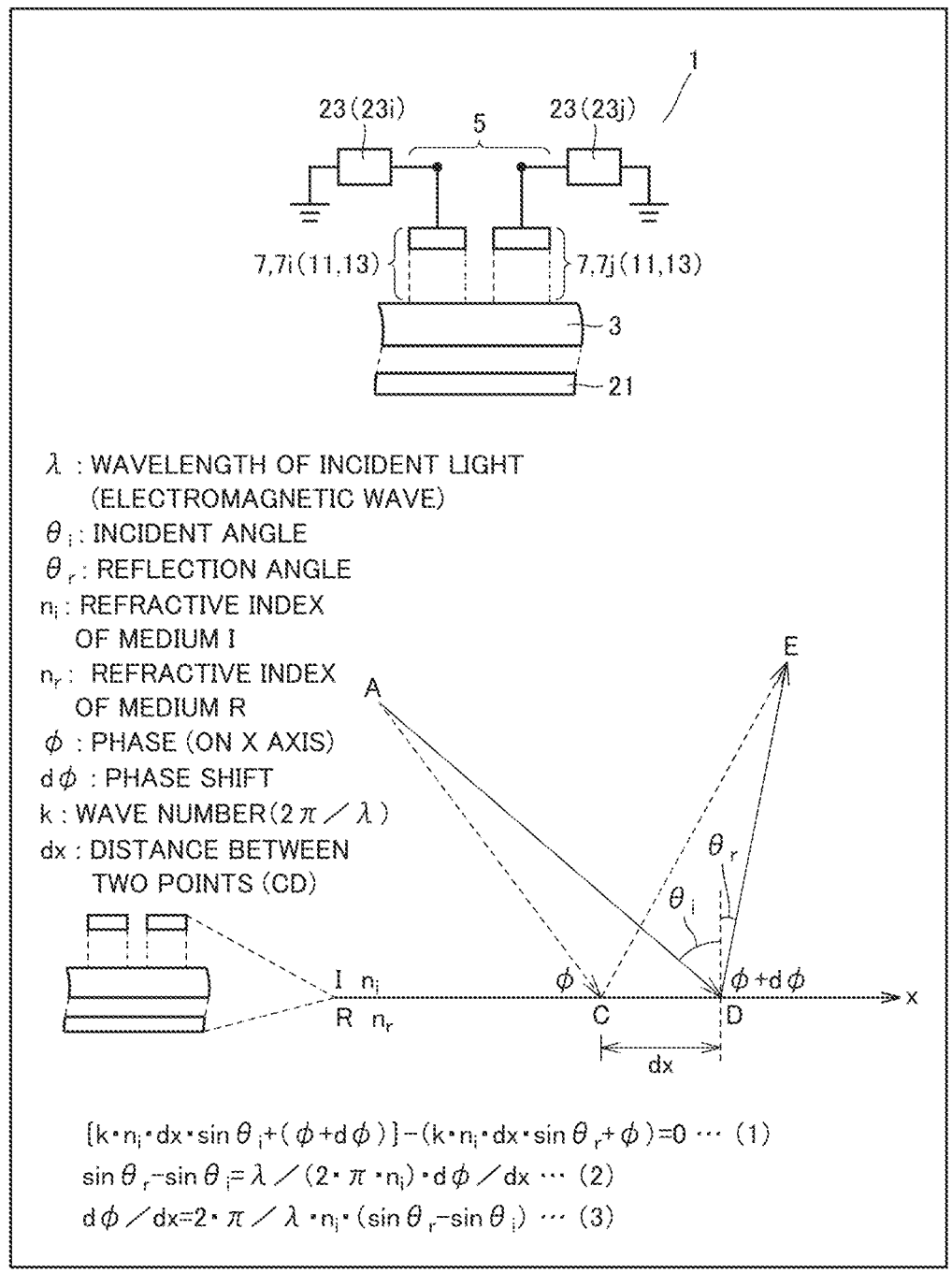
FIG. 1 is a diagram for illustrating a principle of a reflective optical device according to each embodiment.

A basic structure of a reflective optical device 1 is schematically shown on the upper stage of FIG. 1. Reflective optical device 1 has an insulation layer 3 as an insulator, a lattice group 5 as a laminated structure part, and a voltage application unit 23 to apply a voltage to a reflective plate 21 and lattice group 5.

Lattice group 5 is formed on the side of one principal plane with respect to insulation layer 3. Lattice group 5 is composed of a plurality of lattices 7 including a lattice 7i and a lattice 7j. Each of plural lattices 7 has a structure in which a dielectric layer 11 and a graphene layer 13 as a two-dimensional material layer are laminated as a laminated structure.

Voltage application unit 23 has a function of individually applying a voltage to each of lattice group 5. Voltage application unit 23 includes, for example, a voltage application unit 23i to apply a first voltage to lattice 7i, and a voltage application unit 23j to apply a second voltage to lattice 7j. Reflective plate 21 is disposed on the side of the other principal plane with respect to insulation layer 3.

Figure 2:
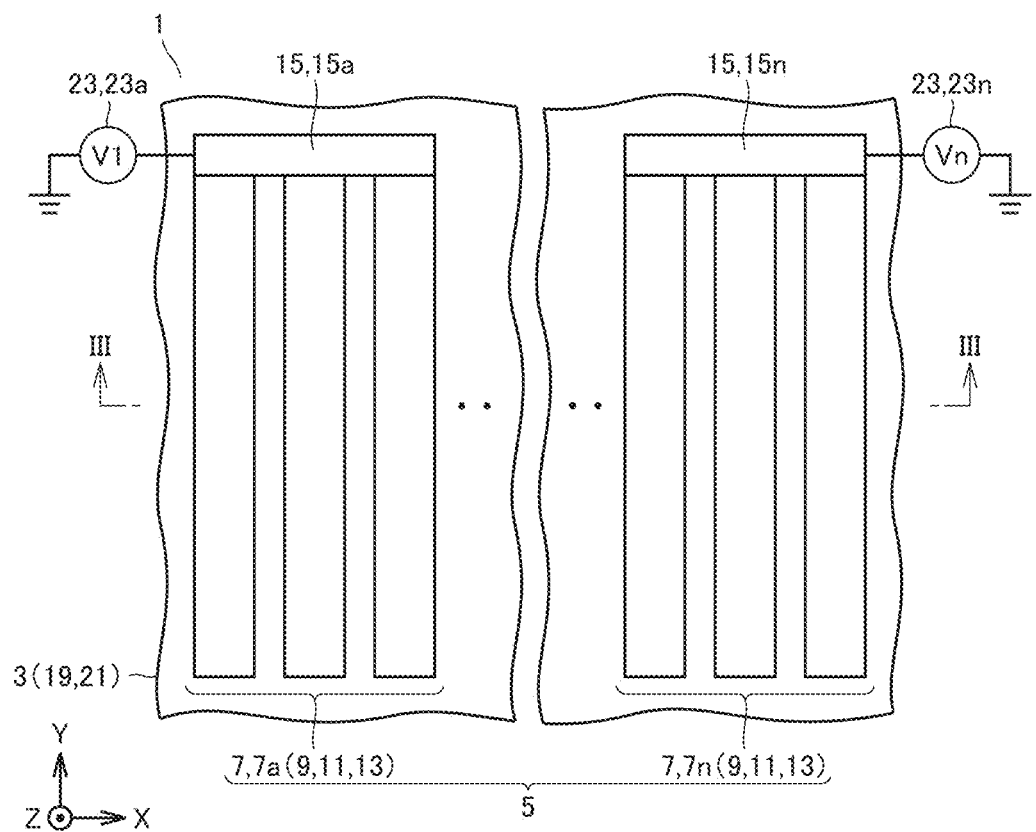
FIG. 2 is a plan view showing one example of a reflective optical device according to Embodiment 1.
Figure 3:
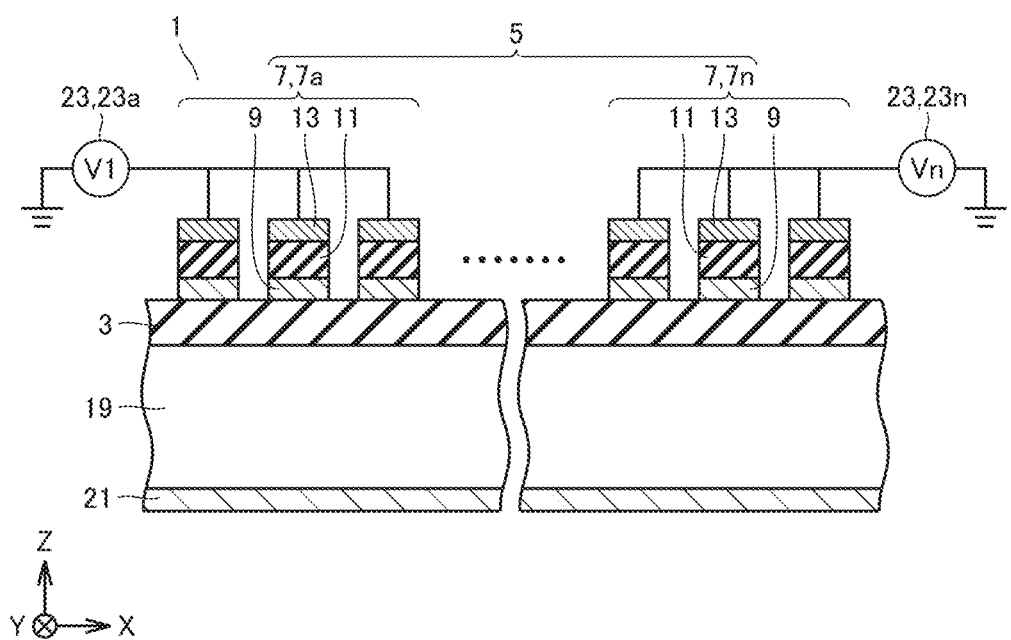
FIG. 3 is a sectional view in a section line shown in FIG. 2 in Embodiment 1.

Next, by referring to FIG. 2 and FIG. 3, an operation principle of reflective optical device 1 is described for the case where an electromagnetic wave (incident light) enters lattice group 5. In lattice group 5, a phenomenon called resonance that the incident electromagnetic wave is reinforced between graphene layer 13 and a graphene layer 9, and between graphene layer 13 or the like and reflective plate 21 occurs. In the vicinity of graphene layer 13, a phenomenon called plasmon resonance occurs.

When the electromagnetic wave having entered one lattice 7 resonates, the phase of the electromagnetic wave to be reflected is delayed from the phase of the incoming electromagnetic wave. The stronger the resonance, the larger the variation in phase becomes. While the variation in phase is determined also by the physical shape including lattice group 5, the refractive index of graphene layer 13 can be varied by the voltage applied to graphene layer 13. Therefore, it becomes possible to electrically control the phase of the electromagnetic wave to be reflected.

Thus, in reflective optical device 1, the phase of the electromagnetic wave to be reflected in each lattice 7 varies by the voltage applied to graphene layer 13 of each lattice 7 in lattice group 5 located inside the spot of the incoming electromagnetic wave. According to the Huygens' principle, the orientation of the wave front of the electromagnetic wave to be reflected is determined by the phase of the electromagnetic wave to be reflected in each lattice 7. In other words, by controlling the phase of the electromagnetic wave to be reflected by the voltage applied to each lattice 7 such that the wave front is oriented at a desired reflection angle, it is possible to electrically vary the reflection angle.

Next, an incident angle and a reflection angle of an electromagnetic wave and a phase of the electromagnetic wave are described on the basis of the generalized Snell's law. As shown in FIG. 1, the case where an electromagnetic wave enters from a medium I toward the interface between medium I and a medium R is assumed. The size of lattice group 5 of reflective optical device 1 or the like is set to be shorter than the wavelength of the incoming electromagnetic wave. Therefore, viewing from the electromagnetic wave, each lattice 7 can be grasped as a point, and it is safe to assume that reflective optical device 1 is located on the interface.

Here, as an optical path of the electromagnetic wave, two optical paths ACE and ADE are assumed. Optical path ACE is an optical path in which the electromagnetic wave reaches a point C from a point A, and reaches a point E after being reflected at point C. Optical path ADE is an optical path in which the electromagnetic wave reaches a point D from point A, and the electromagnetic wave is reflected at point D to reach point E. The interface where reflective optical device 1 is disposed is defined as X axis (see PTL 1).

Wavelength of incident light (electromagnetic wave) is denoted by $\lambda$, incident angle is denoted by $\theta i$, reflection angle is denoted by $\theta r$, refractive index of medium I is denoted by ni, refractive index of medium R is denoted by nr, phase of electromagnetic wave at point C is denoted by $\varphi$, phase of electromagnetic wave at point D is denoted by $\varphi+d\varphi$, distance between point C and point D is denoted by dx, and wave number is denoted by $k(=2\pi/\lambda)$.

When optical path ADE and optical path ACE infinitely approach, the phase difference is 0. This is represented by the following formula (1):

$$\{k \cdot ni \cdot dx \cdot \sin \theta i+(\varphi+d\varphi)\}-(k \cdot ni \cdot dx \cdot \sin \theta r+\varphi)=0 \quad (1).$$

From formula (1), the following formula (2):

$$\sin \theta r-\sin \theta i=\lambda/(2\cdot\pi\cdot ni)\cdot d\varphi dx \quad (2)$$

is derived.

Further, from formula (2), the following formula (3):

$$d\varphi/dx=2\cdot\pi/\lambda\cdot ni\cdot(\sin \theta r-\sin \theta i) \quad (3)$$

is derived.

Once incident angle and reflection angle are determined, variation in phase may be set to satisfy the relationship of formula (3). If the phase of the electromagnetic wave can be varied on X axis, the reflection angle $\theta r$ can be varied independently of refractive indexes ni, nr.

In the coordinates where each lattice 7 of lattice group 5 arranged on X axis is located, if the phase continuously varies according to formula (2), the advancing direction of the wave front of the diffracted electromagnetic wave can be varied by the variation in phase at each lattice 7 (coordinate) in accordance with the Huygens' principle. That is, the reflection angle of the electromagnetic wave can be varied. Hereinafter, in each embodiment, the structure of the reflective optical device is specifically described.

Embodiment 1

One example of a reflective optical device according to Embodiment 1 is described. As shown in FIG. 2 and FIG. 3, in reflective optical device 1, insulation layer 3 as an insulator is formed to cover one of faces of a substrate 19. Lattice group 5 as a laminated structure part having a plurality of laminated structures is formed to be in contact with one of the principal planes (first principal plane) of insulation layer 3. Reflective plate 21 is formed to cover the other face of substrate 19.

Substrate 19 has a function of holding the entirety of reflective optical device 1. Substrate 19 is formed, for example, of a semiconductor material such as silicon (Si). Specifically, a high-resistivity silicon substrate can be employed. Also, a substrate having enhanced insulating properties, for example, by formation of a thermal oxide film on the surface of a silicon substrate may be used. In the substrate on which a thermal oxide film is formed, the thermal oxide film may also serve as insulation layer 3. Further, a silicon substrate to which an impurity is added may be used to form reflective plate 21.

Further, as substrate 19, a II-V group semiconductor may be employed. Further, as a material for substrate 19, mercury cadmium telluride (HgCdTe), indium antimonide (InSb), TypeII superlattice or the like material may be employed. The substrate to which such a material is employed has a characteristic bandgap. The substrate having a characteristic bandgap is capable of causing generation of an optical gate effect. This will be described later.

As insulation layer 3, for example, silicon oxide ($SiO_2$), silicon nitride (SiN), hafnium oxide (HfO), aluminum oxide, nickel oxide, tantalum oxide, or boron nitride (BN) can be employed. In particular, boron nitride (BN) has an atomic arrangement that resembles the atomic arrangement of the graphene layer, so that migration of electric charges is not inhibited if boron nitride comes into contact with the graphene layer. Therefore, boron nitride little inhibits the performance such as electron mobility of the graphene layer, and is favorable as a base film of graphene layer 9.

Reflective plate 21 is formed of metal such as gold, silver, or aluminum. In reflective optical device 1, it is preferred to use a metal having high reflectance with respect to the wavelength of the incoming electromagnetic wave for reflective plate 21 to have the function of reflecting electromagnetic waves. For example, when the incoming electromagnetic wave is an electromagnetic wave of the infrared wavelength range, aluminum or gold is desirably used.

Lattice group 5 as a laminated structure part having a plurality of laminated structures include three or more lattices 7 including a lattice 7a and a lattice 7n. Here, letting n be a natural number of greater than or equal to 3, the laminated structure part includes a plurality of laminated structures including the first laminated structure to the n-th laminated structure. Specifically, lattice group 5 as a laminated structure part having a plurality of laminated structures has a plurality of striped lattices 7 including lattice 7a as a first lattice, and lattice 7n as a second lattice. Each of lattices 7 is arranged apart from each other in the direction of X axis. Each of lattices 7 has a structure in which graphene layer 9, dielectric layer 11 and graphene layer 13 are laminated as a laminated structure. In this description, "n" appended to a reference sign (such as 7, 23) is part of the reference sign, and is distinguished from natural number n.

Graphene layer 9, 11 may be a monolayer or two or more layers. A monolayer graphene layer is a sheet-like substance having a single atomic layer having a lattice structure in which carbon atoms are bounded in a hexagonal shape, and is a representative two-dimensional atomic layer material. The thickness corresponds to the single atomic layer, and is very thin. The charge mobility is about 100 times the charge mobility of silicon, and it is known that the monolayer graphene layer has high charge mobility.

In the case of a graphene layer in which two or more atomic layers are laminated, in any two atomic layers contained in the graphene layer, the orientation of the lattice vector of the hexagonal lattice in one of the atomic layers, and the orientation of the lattice vector of the hexagonal lattice in the other of the atomic layers need not coincide with each other, and the orientation of one lattice vector and the orientation of the other lattice vector may deviate from each other. Also the graphene layer in which the orientation of one lattice vector and the orientation of the other lattice vector completely coincide with each other may be applied.

When a nanoribbon-shaped graphene is used as a graphene layer, the graphene layer has a structure composed of a monolayer graphene nanoribbon layer, or a structure in which two or more graphene nanoribbon layers are laminated. Also, the graphene layer may have a structure in which graphene nanoribbons are periodically arranged on the flat surface.

In a structure in which graphene nanoribbons are periodically arranged, plasmon resonance occurs in the graphene nanoribbons, and resonance occurs at a specific wavelength, so that the variation in phase of the electromagnetic wave to be reflected can be enlarged. Further, the graphene layer may be a non-doped graphene layer in which no impurity is added, or a doped graphene layer in which a p-type or n-type impurity is added.

In lattice group 5 as a laminated structure part having a plurality of laminated structures, an electrode part having a plurality of electrodes 15 electrically connected with lattice group 5 is formed. As plural electrodes 15, electrodes 15 including the first electrode to the n-th electrode are formed sequentially in the laminated structures including the first laminated structure to the n-th laminated structure. Specifically, in each of plural lattices 7, electrode 15 is formed to be in contact with graphene layer 13 which is a top layer. For each of plural lattices 7, voltage application unit 23 to individually apply a voltage is provided. For example, in lattice 7a, electrode 15a is formed. To electrode 15a, a voltage application unit 23a is electrically connected. In lattice 7n, electrode 15n is formed. To electrode 15n, a voltage application unit 23n is electrically connected.

As described above, by individually applying a voltage to each of lattices 7 from voltage application unit 23 via electrode 15, conductivity and refractive index of respective graphene layers 13 of lattices 7 vary, and optical characteristics of graphene layer 13 can be electrically changed.

Voltage application unit 23 that is electrically connected to each of lattices 7 (graphene layers 13) is provided with an electronic circuit (not shown) for applying a desired voltage. The circuit configuration of the electronic circuit is not limited as long as a voltage that is enough to cause a variation in phase required for controlling the reflection angle can be applied to each lattice 7.

Figure 4:
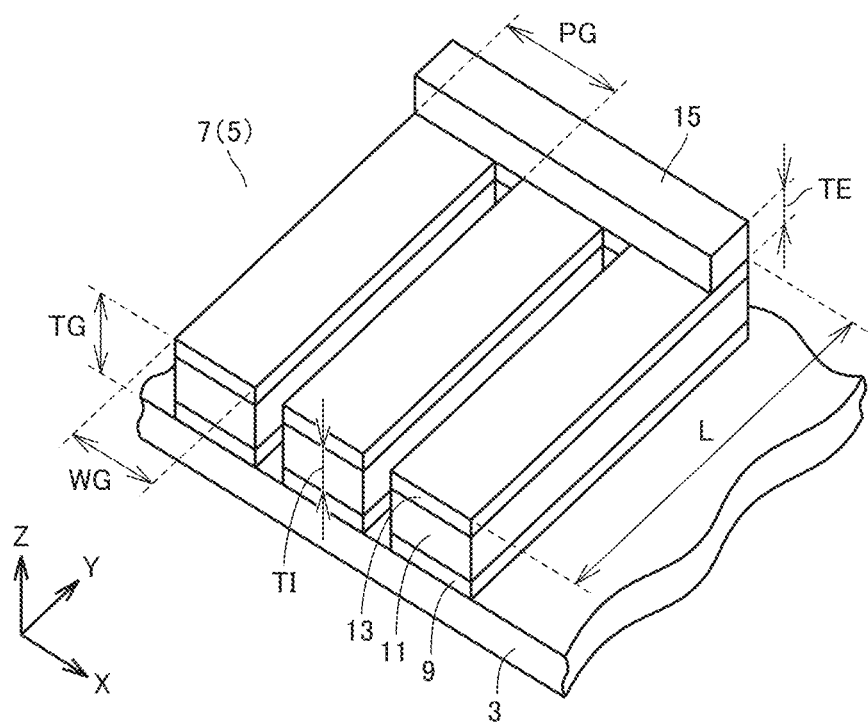
FIG. 4 is a perspective view for illustrating a shape of the reflective optical device in Embodiment 1.

As shown in FIG. 4, in each lattice 7, length in X axial direction as the first direction is denoted by width WG, length in Y axial direction as the second direction is denoted by extending length L, period (pitch) in X axial direction of lattice 7 is denoted by period PG, thickness (Z axial direction) of lattice 7 is denoted by thickness TG, thickness of electrode 15 is denoted by thickness TE, and thickness of dielectric layer 11 is denoted by thickness TI.

Width WG as the first width and the second width, thickness TG, period PG, and length L are set to be shorter than the wavelength of a target electromagnetic wave. Here, for every lattice 7, each of width WG, thickness TG, period PG and length L is set to be the same value as a structure of the lattice. Width WG is set to be, for example, about several tens nanometers. Thickness TG is set to be about several tens nanometers. Period PG is set to be, for example, about several hundred nanometers. Thickness TE is set to be about several tens nanometers. Lattice group 5 is arranged to be located within the spot diameter of an incoming electromagnetic wave.

By varying width WG, length L, period PG and the like, it is possible to vary the resonance wavelength. Generally, in lattice 7 having a multilayer structure (lattice group 5), width WG is a main parameter for controlling the resonance wavelength. As width WG decreases, the resonance wavelength shifts to a shorter wavelength.

Also, by varying thickness TI of dielectric layer 11, the resonance wavelength can be controlled. Since resonance (guided mode) occurs between graphene layer 13 and graphene layer 9 that sandwich dielectric layer 11, the larger thickness TI of dielectric layer 11, the longer the wavelength of the incoming electromagnetic wave becomes. Further, the smaller the interval between neighboring lattice 7 and lattice 7 (period PG-width WG), the stronger the resonance, and the variation in phase of the electromagnetic wave to be reflected can be enlarged. This is because a gap resonance occurs between neighboring lattice 7 and lattice 7.

In the case where plural lattices 7 as lattice group 5 are arranged one-dimensionally, and the incoming electromagnetic wave has polarization, the phase of the electromagnetic wave can be effectively varied by arranging the reflective optical device and the electromagnetic wave such that the orientation of the electric field of the electromagnetic wave is parallel with the width direction of lattice 7. Therefore, in this case, it is desired to set length L of lattice 7 larger than the wavelength of the electromagnetic wave. Reflective optical device 1 according to Embodiment 1 is configured as described above.

Figure 5:
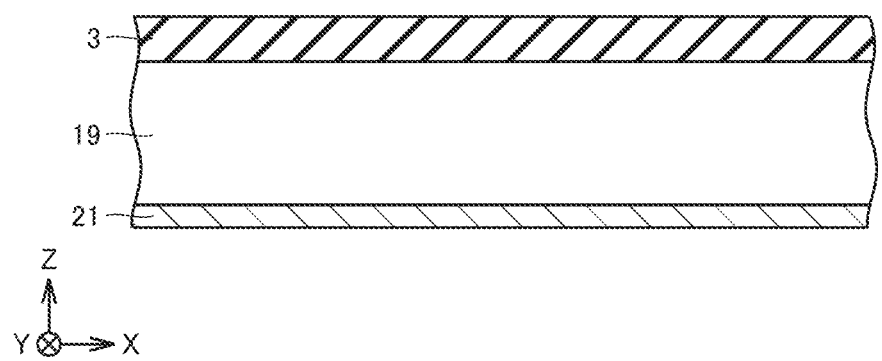
FIG. 5 is a sectional view showing one step of a method for producing the reflective optical device in Embodiment 1.

Next, one example of a method for producing above-described reflective optical device 1 is described. As shown in FIG. 5, substrate 19 formed, for example, of silicon is prepared. Substrate 19 has a front face and a rear face that are opposed to each other. Next, insulation layer 3 is formed on the front face of substrate 19. When substrate 19 is formed of silicon, insulation layer 3 may be silicon oxide ($SiO_2$) formed by subjecting substrate 19 to a thermal oxidization treatment. Insulation layer 3 may be formed by using, for example, Chemical Vapor Deposition (CVD) or sputtering besides the thermal oxidation treatment.

Next, on the rear face of substrate 19, reflective plate 21 is formed, for example, by sputtering or vapor deposition. Reflective plate 21 is formed, for example, of gold (Au), silver (Ag), copper (Cu), aluminum (Al), nickel (Ni), or chromium (Cr). In order to enhance the adhesion between substrate 19 and reflective plate 21, an adhesion film (not shown) of, for example, chromium (Cr) or titanium (Ti) may be formed between substrate 19 and reflective plate 21.

Figure 6:
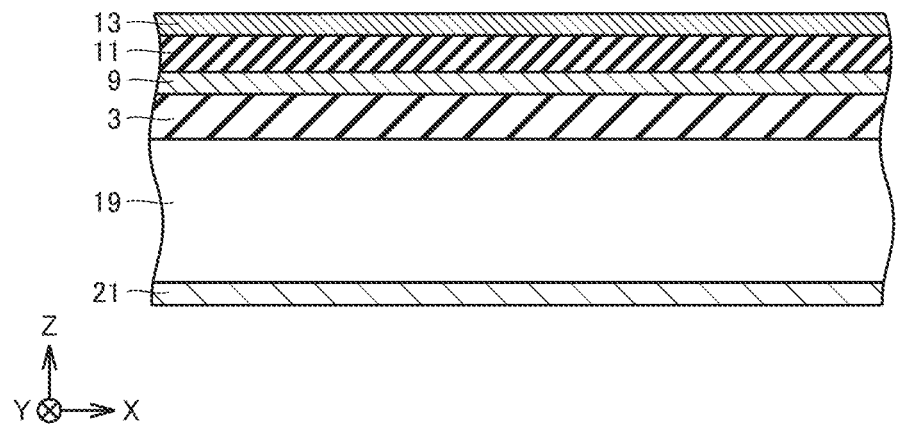
FIG. 6 is a sectional view showing a step conducted after the step shown in FIG. 5 in Embodiment 1.

Next, as shown in FIG. 6, graphene layer 9 is formed, for example, by an epitaxial growth method to cover the surface of insulation layer 3. Besides the epitaxial growth method, for example, a graphene layer formed by a CVD method may be preliminarily transferred, and bonded to insulation layer 3. Also, a graphene layer peeled off by machine peeling or the like may be transferred and bonded.

Next, dielectric layer 11 is formed, for example, by a vapor deposition method or an atomic layer deposition (ALD) method to cover graphene layer 9. As dielectric layer 11, for example, a silicon oxide film ($SiO_2$), a silicon nitride film (SiN), an alumina film, a tantalum oxide film, an ITO film, magnesium fluoride (MgF$_2$), magnesium oxide (MgO), or hafnium oxide (HfO$_2$) is formed. Next, graphene layer 13 is formed to cover dielectric layer 11.

Figure 7:
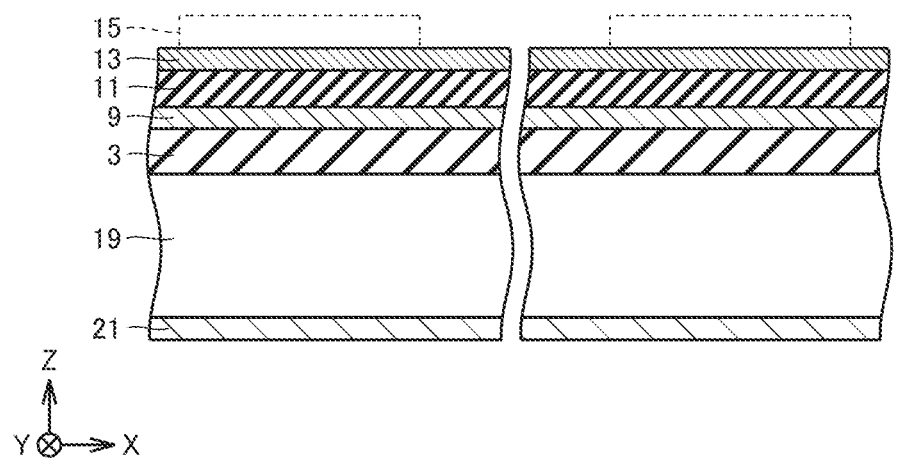
FIG. 7 is a sectional view showing a step conducted after the step shown in FIG. 6 in Embodiment 1.

Next, as shown in FIG. 7, electrode 15 is formed. Electrode 15 is formed, for example, of gold (Au), silver (Ag), copper (Cu), aluminum (Al), nickel (Ni), or chromium (Cr). In order to enhance the adhesion between graphene layer 13 and electrode 15, an adhesion film (not shown) of, for example, chromium (Cr) or titanium (Ti) may be formed between graphene layer 13 and electrode 15.

By using a photomechanical process, Electron Beam (EB) drawing or the like, a resist mask in which the region where the electrode is to be arranged is open (not shown) is formed. After forming the resist mask, a metal film of gold (Au) or the like is formed, for example, by vapor deposition or sputtering. Then, the resist mask is removed to form electrode 15.

Figure 8:
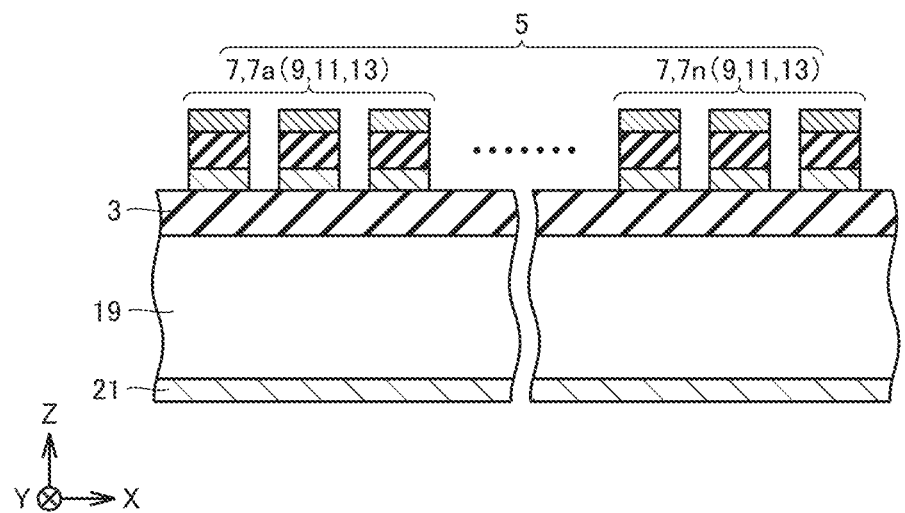
FIG. 8 is a sectional view showing a step conducted after the step shown in FIG. 7 in Embodiment 1.

Next, by conducting a photomechanical process, a resist mask (not shown) for patterning a lattice group is formed. Next, by using gas such as oxygen plasma or methane and using a resist mask as an etching mask, the graphene layer and the dielectric layer are subjected to an etching treatment. Thus, as shown in FIG. 8, lattice group 5 composed of a plurality of lattices 7 is patterned. In this way, the main part of reflective optical device 1 is completed.

In above-described reflective optical device 1, by individually applying a voltage to each of lattices 7 from voltage application unit 23 via electrode 15, conductivity and refractive index of respective graphene layers 13 of lattices 7 vary, and optical characteristics of graphene layer 13 can be electrically changed.

Figure 9:
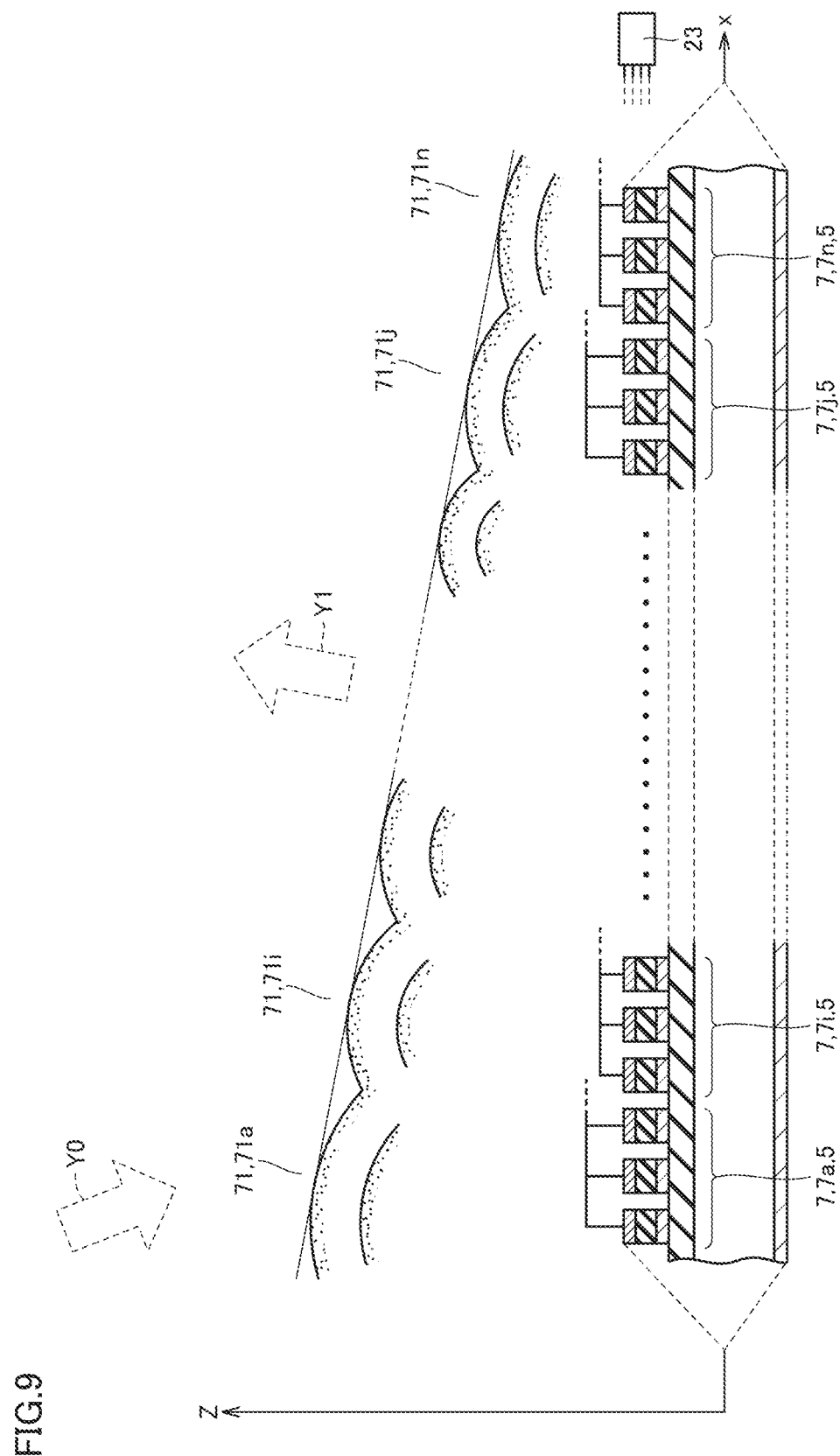
FIG. 9 is a diagram schematically showing operation of the reflective optical device in Embodiment 1.

Here, as shown in FIG. 9, for example, a reflective optical device in which plural lattices 7 including lattices 7a, 7i, 7j, 7n as lattice group 5 are arranged one-dimensionally along X axis is assumed. For plural lattices 7, by varying the voltage applied to respective graphene layers 13 stepwise from lattice 7a toward lattice 7n, conductivity and refractive index of respective graphene layers 13 of lattices 7 vary. Thus, the phase of the electromagnetic wave varies stepwise along X axis when the electromagnetic wave (arrow Y0) having entered lattice group 5 is reflected.

By simultaneously applying a series of DC voltages that gradually increase (or decrease), for example, by 0.1 V from lattice 7a toward lattice 7n, to graphene layer 13 of each lattice 7, the direction in which the electromagnetic wave is to be reflected can be changed. Also, by simultaneously applying other series of DC voltages that are different from the series of DC voltages, the electromagnetic wave can be reflected in the direction different from the direction in which the electromagnetic wave is reflected when the series of DC voltages are applied, and thus the direction in which the electromagnetic wave is to be reflected can be controlled by the voltage applied to graphene layer 13 of each lattice 7.

Therefore, the line connecting crests of electromagnetic wave (71, 71a, 71i, 71j, 71n) to be reflected in each lattice 7 has inclination with respect to X axis where reflective optical device 1 is arranged. Thus, the electromagnetic wave to be reflected in each lattice 7 as a whole is reflected toward the inclined direction (arrow Y1). In this manner, by varying the voltage applied to each of plural lattices 7, conductivity and refractive index of graphene layer 13 vary depending on the voltage. As a result, the phase of the electromagnetic wave varies by voltage, and the direction in which the electromagnetic wave is reflected can be controlled in reflective optical device 1.

Further, in above-described reflective optical device 1, especially dielectric layer 11 that forms part of lattice 7 is formed at intervals in plural lattices 7. Accordingly, the phase of the electromagnetic wave to be reflected in a part of the dielectric layer located between lattices does not vary in contrast to the structure where dielectric layers are successively connected in plural lattices. Thus, as to the reflection wave, only the variation in phase in lattices is dominant. No phase difference arises in a lattice and between a dielectric located between lattices. Therefore, interference of the electromagnetic wave is prevented, and high order diffracted light disappears or extremely diminishes. Thus, the electromagnetic wave to be reflected is only the main mode, and high order diffracted light disappears, so that it is possible to prevent the intensity of the electromagnetic wave to be reflected from decreasing.

Figure 10:
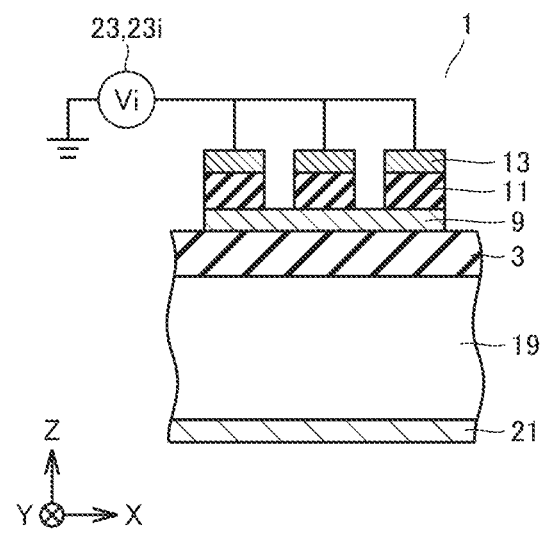
FIG. 10 is a partial sectional view showing a reflective optical device according to one modified example in Embodiment 1.
Figure 11:
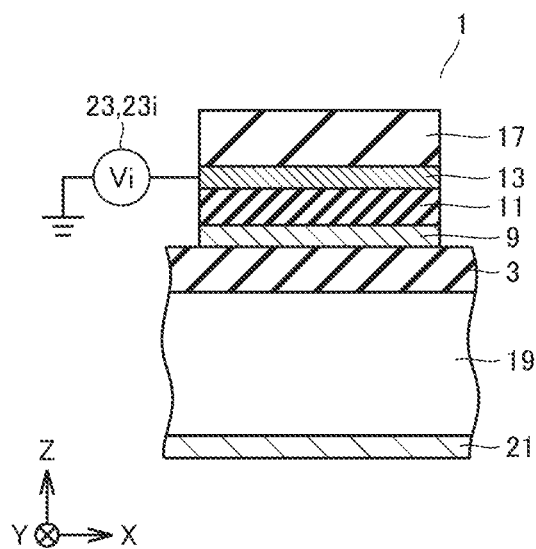
FIG. 11 is a partial sectional view showing a reflective optical device according to another modified example in Embodiment 1.

In above-described reflective optical device 1, description was made for the case where electrically-floating graphene layer 9 that is not connected with electrode 15 is individually formed in plural lattices 7. As shown in FIG. 10, electrically-floating graphene layers 9 may be formed to connect with each other between neighboring lattices 7. Also, as shown in FIG. 11, besides lattice 7 having a three-layer structure composed of graphene layer 9, dielectric layer 11, and graphene layer 13, lattice 7 having a multi-layer structure in which dielectric layer 17 is further formed to cover graphene layer 13 is also applicable. Also, in a reflective optical device in which electrically-floating graphene layer 9 is not formed, it is possible to vary the reflection angle without decreasing the intensity of the electromagnetic wave to be reflected.

Embodiment 2

In Embodiment 1, description was made for reflective optical device 1 in which each of width WG, thickness TG, period PG, and length L is set to be the same value for every lattice 7. Here, description is made for a reflective optical device including lattices having different stripe shapes of lattice. The member that is the same as that in reflective optical device 1 shown FIG. 2 and FIG. 3 is denoted by the same reference sign, and description thereof is omitted unless necessary.

Here, i and j denote natural numbers of greater than or equal to 1 and less than or equal to n that are different from each other, and among three or more laminated structures of the first laminated structure to the n-th laminated structure, one laminated structure is named an i-th laminated structure, and the other laminated structure is named a j-th laminated structure. Lattice group 5 includes the i-th laminated structure as an i-th lattice, and the j-th laminated structure as a j-th lattice. The i-th lattice includes a plurality of i-th laminated structures having a third width and a third length, and arranged at a third pitch. The j-th lattice includes a plurality of j-th laminated structures having a fourth width and a fourth length, and arranged at a fourth pitch. In this description, "i" or "j" appended to a reference sign (such as 7, 23) is part of the reference sign, and is distinguished from natural number "i" or "j".

Figure 12:
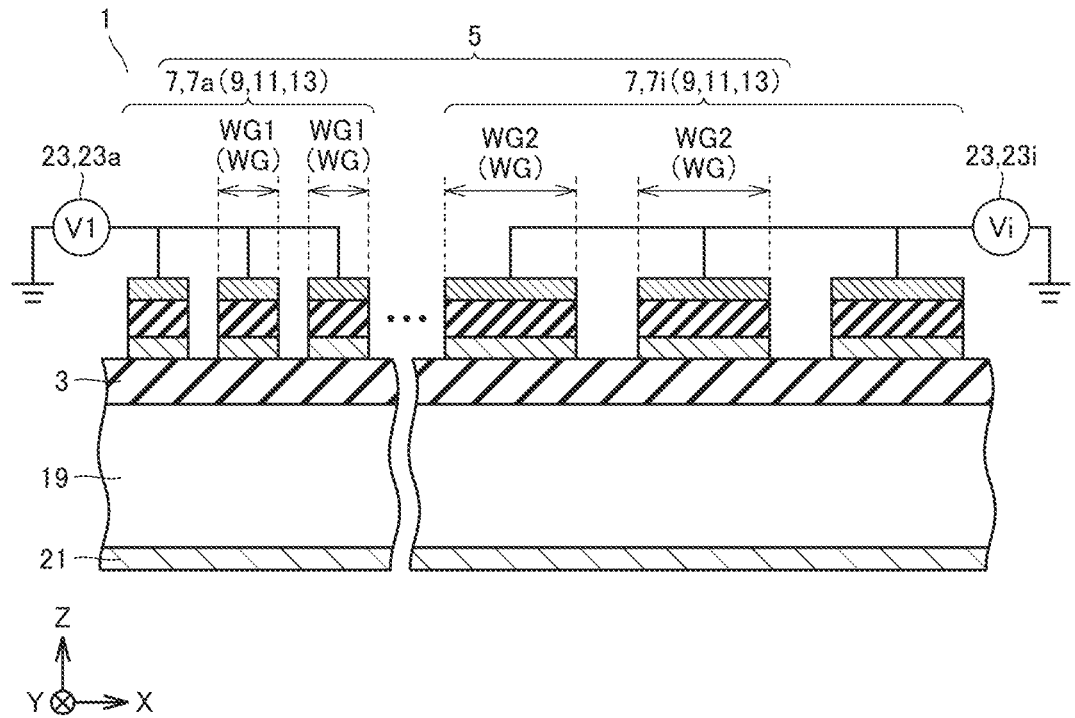
FIG. 12 is a sectional view showing one example of a reflective optical device according to Embodiment 2.

Between the i-th lattice and the j-th lattice, the third width and the fourth width may differ. One example of reflective optical device 1 having lattices 7 with different widths WG is specifically shown in FIG. 12. As shown in FIG. 12, reflective optical device 1 includes as lattice group 5, lattice 7a having a width WG1 and lattice 7i having a width WG2. Width WG2 is larger than width WG1.

Figure 13:
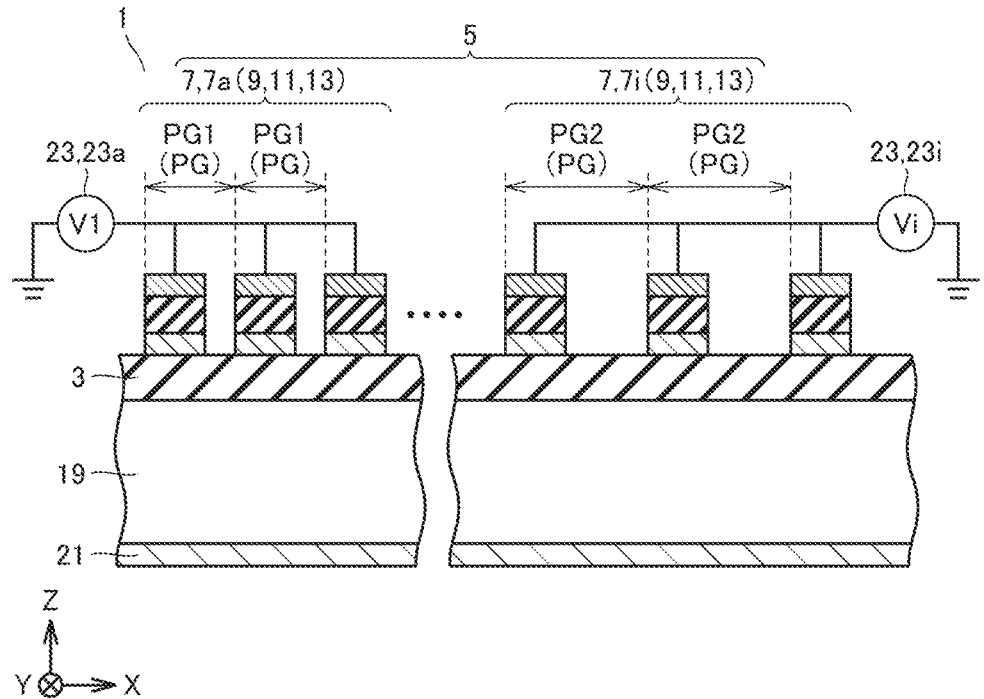
FIG. 13 is a sectional view showing another example of the reflective optical device in Embodiment 2.

Between the i-th lattice and the j-th lattice, the third pitch (period) and the fourth pitch (period) may differ. One example of reflective optical device 1 having lattices 7 with different periods PG is specifically shown in FIG. 13. As shown in FIG. 13, reflective optical device 1 includes as lattice group 5, lattice 7a having a period PG1 and lattice 7i having a period PG2. The period PG2 is longer than the period PG1.

Figure 14:
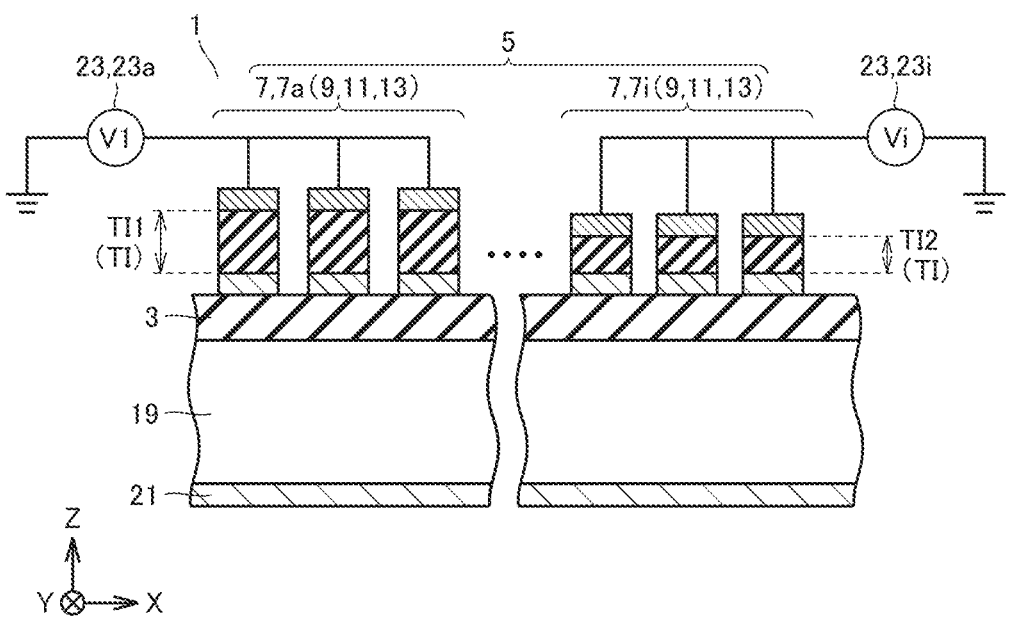
FIG. 14 is a sectional view showing still another example of the reflective optical device in Embodiment 2.

Between the i-th lattice and the j-th lattice, the thickness of dielectric layer 11 may differ. One example of reflective optical device 1 having lattices 7 including dielectric layers with different thicknesses TI is specifically shown in FIG. 14. As shown in FIG. 14, reflective optical device 1 includes as lattice group 5, lattice 7a having a thickness TI1 and lattice 7i having a thickness TI2. Thickness TI1 is larger than thickness TI2.

Figure 15:
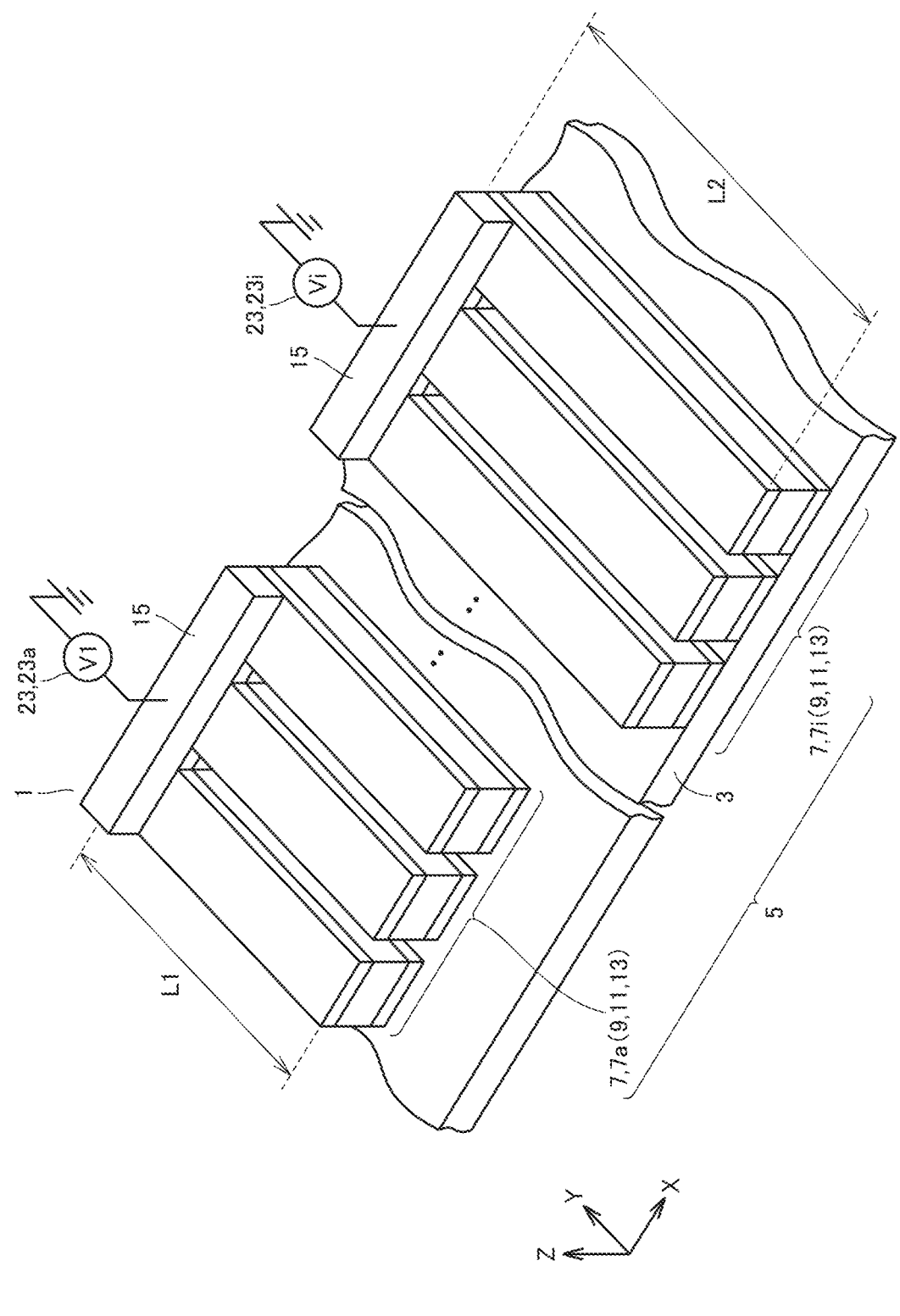
FIG. 15 is a partial perspective view showing yet still another example of the reflective optical device in Embodiment 2.

Between the i-th lattice and the j-th lattice, the third length and the fourth length may differ. One example of reflective optical device 1 having lattices 7 with different lengths L is specifically shown in FIG. 15. As shown in FIG. 15, reflective optical device 1 includes as lattice group 5, lattice 7a having a length L1 and lattice 7i having a length L2. Length L2 is greater than length L1.

In Embodiment 1, we stated that the phase of the electromagnetic wave to be reflected in lattice 7 is controlled basically by the voltage applied to graphene layer 13. Also we stated that the phenomenon called resonance that the electromagnetic wave is reinforced, for example, between graphene layer 13 and graphene layer 9 occurs, and the phase of the electromagnetic wave to be reflected varies. Further, we stated that the phase of the electromagnetic wave varies also by plasmon resonance occurring in the vicinity of graphene layer 13.

This suggests that in reflective optical device 1, the resonating wavelength of electromagnetic wave can be varied by changing the physical shape of lattice 7 besides the voltage applied to graphene layer 13, and the phase of the electromagnetic wave having the wavelength corresponding to the resonance can be varied. Also, since the resonating wavelength can be varied, electromagnetic waves having plural wavelengths can be objects to be reflected.

Specifically, in reflective optical device 1 shown in FIG. 12, the electromagnetic wave having a wavelength that resonates with lattice 7a having width WG1 and the electromagnetic wave having a wavelength that resonates with lattice 7i having width WG2 can be objects to be reflected. The wavelength of the latter is longer than the wavelength of the former.

In reflective optical device 1 shown in FIG. 13, the electromagnetic wave having a wavelength that resonates with lattice 7a having period PG1 and the electromagnetic wave having a wavelength that resonates with lattice 7i having period PG2 can be objects to be reflected. The wavelength of the latter is longer than the wavelength of the former.

In reflective optical device 1 shown in FIG. 14, the electromagnetic wave having a wavelength that resonates with lattice 7a having thickness TI1 and the electromagnetic wave having a wavelength that resonates with lattice 7i having thickness TI2 can be objects to be reflected. The wavelength of the latter is shorter than the wavelength of the former.

In reflective optical device 1 shown in FIG. 15, the electromagnetic wave having a wavelength that resonates with lattice 7a having length L1 and the electromagnetic wave having a wavelength that resonates with lattice 7i having length L2 can be objects to be reflected. The wavelength of the latter is longer than the wavelength of the former.

As seen from the above, as an electromagnetic wave that is an object to be reflected, not only electromagnetic waves having a single wavelength, but also electromagnetic waves having a plurality of wavelengths can be objects to be reflected, and the reflection angle can be controlled for electromagnetic waves of broad wavelength regions including electromagnetic waves having plural wavelengths.

Meanwhile, when the wavelength of the electromagnetic wave that is an object to be reflected is predetermined, optimum resonance can be generated by adjusting the physical shape of lattice 7 including width WG, thickness TG, period PG, and length L. Also, for example, by applying the same voltage as the voltage applied to each lattice by periodically changing the physical shape of lattice 7 including width WG, thickness TG, period PG, and length L, it is possible to control the reflection angle of the electromagnetic wave. In this case, all the voltages applied to each lattice 7 can be controlled by one voltage application unit 23, and the number of voltage values to be controlled by voltage application unit 23 can be reduced.

Embodiment 3

Figure 16:
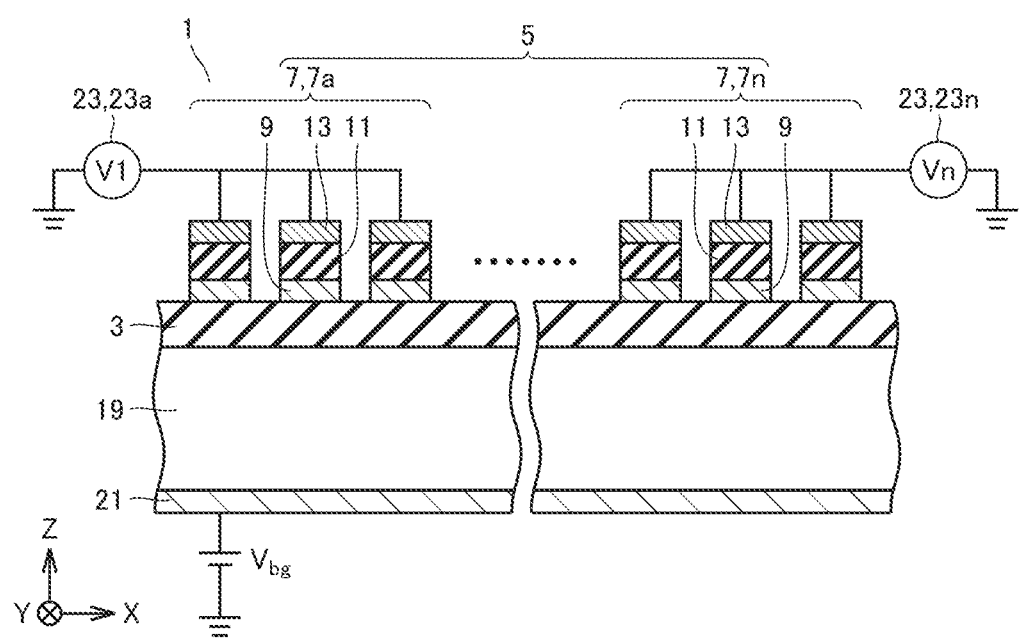
FIG. 16 is a sectional view showing one example of a reflective optical device according to Embodiment 3.

Here, description is made for a reflective optical device in which photoelectric conversion is caused in the substrate, and an optical gate effect is generated in the graphene layer by electric change accompanying the photoelectric conversion. As shown in FIG. 16, in reflective optical device 1, substrate 19 in which photoelectric conversion occurs by the incoming electromagnetic wave is employed. Reflective plate 21 formed on the rear face of substrate 19 is used as a rear surface electrode, and back gate voltage Vbg is applied to reflective plate 21. The remaining configuration is the same as the configuration of reflective optical device 1 shown FIG. 2 and FIG. 3, and hence the same member is denoted by the same reference sign, and description thereof is omitted unless necessary.

Substrate 19 in which photoelectric conversion occurs has a band gap of less than or equal to the energy (hv) of the electromagnetic wave that is an object to be reflected. Here, the optical gate effect of the graphene layer accompanying photoelectric conversion is described while taking a graphene transistor using the graphene layer as a channel, as an example.

Figure 17:
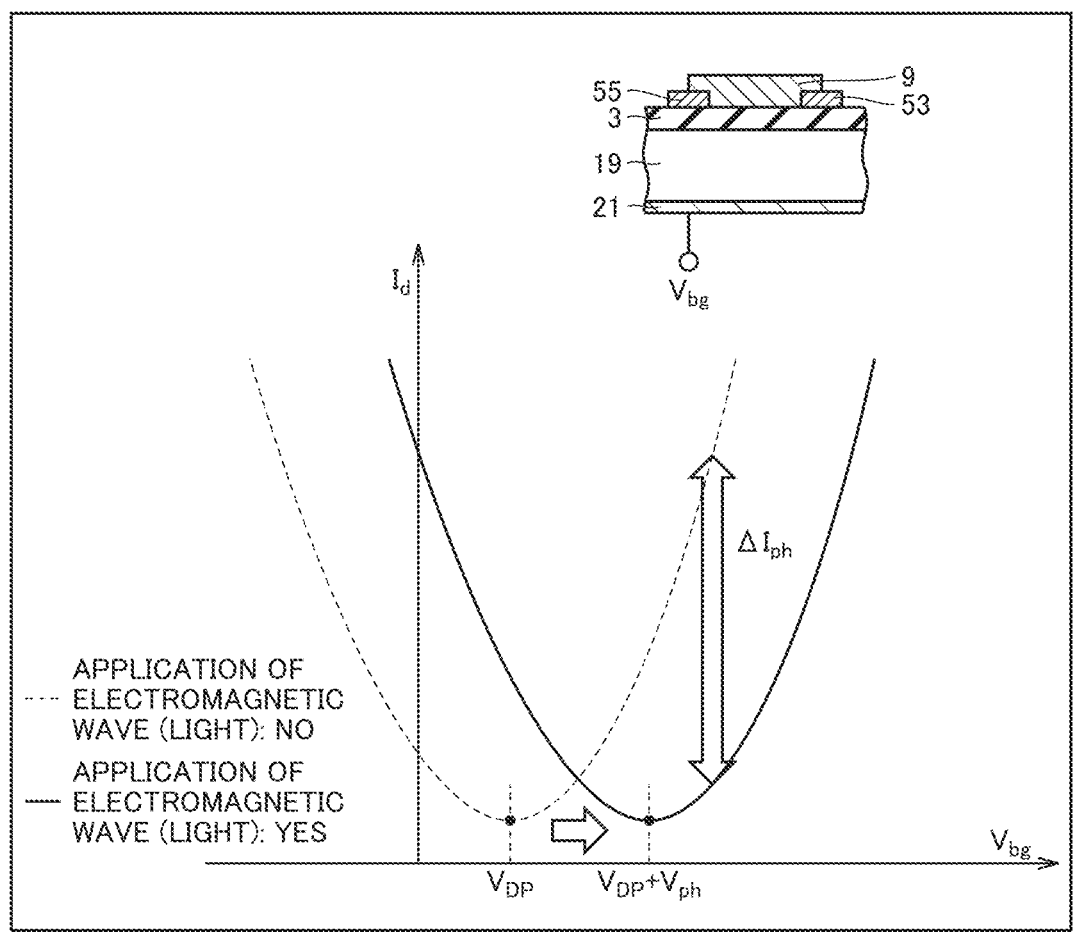
FIG. 17 is a diagram containing a graph for illustrating the effect of the reflective optical device in Embodiment 3.

As shown in FIG. 17, the graphene transistor includes a source electrode 53 formed on substrate 19 with insulation layer 3 being interposed therebetween, a drain electrode 55, and graphene layer 9. Source electrode 53 and drain electrode 55 are distanced from each other. Graphene layer 9 is formed to be interposed between source electrode 53 and drain electrode 55. In graphene layer 9, a channel is formed. To reflective plate 21, back gate voltage Vbg is applied.

In FIG. 17, also the relationship between current Id flowing between source electrode 53 and drain electrode 55, and back gate voltage Vbg is shown in the graph. The horizontal axis represents back gate voltage Vbg, and the vertical axis represents current Id. The graph of the dotted line shows the relationship in the state that no electromagnetic wave is applied. The graph of the solid line shows the relationship in the state that an electromagnetic wave is applied.

Focusing on the graph of the dotted line when no electromagnetic wave is applied, a bipolar transistor operation in a normal graphene layer is achieved when back gate voltage Vbg is varied. At this time, the back gate voltage Vbg that gives a Dirac point is called VDP, and the voltage is called a Dirac point voltage. A Dirac point means a point where the valence band and the conduction band (band structure) in graphene layer 9 intersect.

Focusing on the graph of the solid line when an electromagnetic wave is applied, the Dirac point voltage shifts to the voltage higher than VDP in the solid line graph than in the dotted line graph. As the electromagnetic wave enters substrate 19, holes and electrons are generated by photoelectric conversion in substrate 19. One (electric charge) of the generated holes and electrons goes toward reflective plate 21, and the other (electric charge) goes toward insulation layer 3.

For example, the case where substrate 19 is p-type silicon, and a minus voltage is applied as back gate voltage Vbg is assumed. The generated holes go toward reflective plate 21, and the electrons go toward insulation layer 3. Electrons pooled in the part of substrate 19 directly below graphene layer 9 influence on graphene layer 9 to vary the voltage applied to graphene layer 9.

To graphene layer 9, both back gate voltage Vbg applied from reflective plate 21, and the voltage corresponding to the variation in voltage accompanying the photoelectric conversion are applied. The voltage corresponding to the variation in voltage is represented by Vph. Therefore, when an electromagnetic wave is applied, the Dirac point voltage shifts from VDP to VDP+Vph.

This shift results in generation of differential current (ΔIph) in current Id for the same back gate voltage Vbg between the case where no electromagnetic wave is applied, and the case where an electromagnetic wave is applied. The variation in current (Iph) is about several hundred to several thousand times larger than that in the case of a normal semiconductor according to the estimation based on the mobility and film thickness.

Graphene layer 9 is a very thin layer of a single atomic layer, and has high charge mobility. Therefore, only slight variation in voltage accompanying the photoelectric conversion results in variation in electron density in graphene layer 9 and variation in conductivity of graphene layer 9. That is, by slight variation in voltage accompanying the photoelectric conversion occurring in substrate 19, the refractive index of graphene layer 9 is varied.

Thus, in above-described reflective optical device 1, the voltage applied to graphene layer 13 causes variation in refractive index of graphene layer 13, and additionally photoelectric conversion in substrate 19 causes variation in refractive index of graphene layer 9 on the side of substrate 19. Therefore, in reflective optical device 1, the variation in phase of the electromagnetic wave to be reflected can be made larger than in the case where photoelectric conversion does not occur only when the electromagnetic wave is applied From a different point of view, for the same reflection angle of electromagnetic wave, the power consumption of the reflective optical device can be decreased by the degree caused by photoelectric conversion. On the other hand, for the same power, the reflection angle of the electromagnetic wave can be further broadened by the degree caused by photoelectric conversion.

As a material for substrate 19 in which photoelectric conversion occurs by the optical gate effect, the following materials are recited. In visible light to near infrared rays, for example, silicon is recited. In infrared rays of long-wavelength region, for example, ferroelectric materials such as mercury cadmium telluride (HgCdTe) or lithium niobate (LiNbO$_3$) are recited. In infrared rays of mid-wavelength region, for example, indium antimonide (InSb) is recited.

The material for substrate 19 in which photoelectric conversion occurs is not limited to those described above, and any material (substrate) having a band gap of less than or equal to the energy of the electromagnetic wave that is an object to be reflected is applicable. Also, it suffices that substrate 19 is capable of causing voltage variation in graphene layer 9 by the electromagnetic wave having entered substrate 19. For example, a pn junction may be formed in substrate 19. Also, a quantum dot or a nanowire may be used as a material.

Embodiment 4

Figure 18:
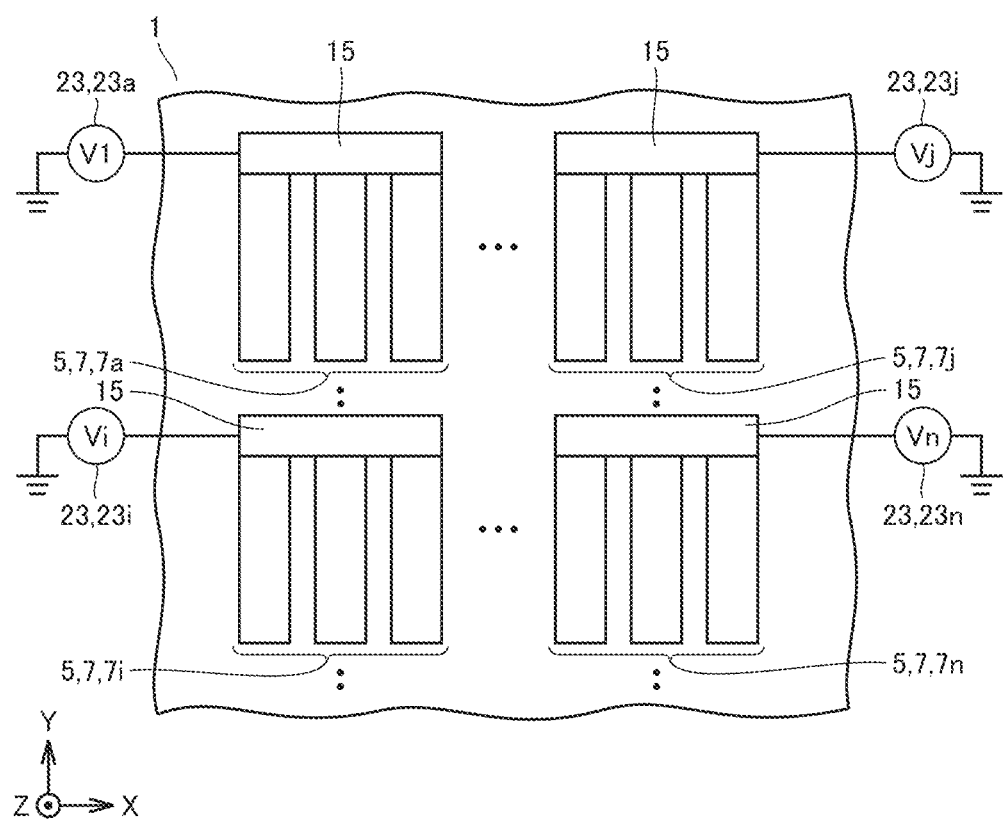
FIG. 18 is a plan view showing one example of a reflective optical device according to Embodiment 4.

Here, one example of a reflective optical device in which lattices are arranged two-dimensionally is described. As shown in FIG. 18, in reflective optical device 1, plural lattices 7 (lattice group 5) including lattices 7a, 7i, 7j, 7n are two-dimensionally arranged in a matrix. Each lattice 7 has, for example, width in X axial direction, and extends in Y axial direction. Width WG, length L, period PG, thickness TG and the like of each lattice 7 (see FIG. 4) are set to be shorter than the wavelength of an electromagnetic wave. Each lattice 7 of lattice group 5 has the same shape in planar view.

To lattice 7a, a voltage is applied by voltage application unit 23a. To lattice 7i, a voltage is applied by voltage application unit 23i. To lattice 7j, a voltage is applied by voltage application unit 23j. To lattice 7n, a voltage is applied by voltage application unit 23n. The sectional structure of each lattice 7 is substantially the same as the sectional structure shown in FIG. 3.

When the electromagnetic wave that is an object to be reflected is a laser beam, the electromagnetic wave often has polarization. In order to effectively vary the phase of the electromagnetic wave to be reflected in such a case, it is desired to arrange the reflective optical device such that the direction of the width of each lattice 7 and the direction of the electric field of the electromagnetic wave coincide (parallel) with each other. Therefore, when the electromagnetic wave whose direction of polarization is determined is an object to be reflected, it is desired that the plurality of lattices are arranged one-dimensionally, and the length in which the lattices extend is set to be longer than the wavelength of the electromagnetic wave.

On the other hand, in the case of non-polarized light (or unpolarized light) in which the direction of the electric field of the electromagnetic wave that is an object to be reflected distributes uniformly in every direction, the efficiency of varying the phase of the electromagnetic wave is impaired in the reflective optical device in which a plurality of lattices are arranged one-dimensionally. That is, assuming the polarization typified in the orthogonal two directions, efficient action of varying the phase of the electromagnetic wave occurs only for either one polarization when a plurality of lattices are arranged one-dimensionally.

In contrast to this, when a plurality of lattices are arranged two-dimensionally as shown in FIG. 18, efficient action of varying the phase of the electromagnetic wave can be generated for any polarization. This suggests that above-described reflective optical device 1 is capable of controlling a phase of an electromagnetic wave even for a non-polarized electromagnetic wave.

In reflective optical device 1 shown in FIG. 18, description was made for the case where each of plural lattices 7 has width in X axial direction, and extends in Y axial direction. Since width WG and length L of each lattice 7 (see FIG. 4) and the like are set to be shorter than the wavelength of the electromagnetic wave, control of the phase of the electromagnetic wave will not be influenced, even if lattice 7i and lattice 7n are arranged such that the respective widths are parallel with Y axial direction, and the lattices extend in X axial, for example. While lattice group 5 composed of lattices 7 having the same shape in plan view is recited as an example of each lattice 7 of lattice group 5, lattice group 5 may include lattice 7 having a different shape in plan view.

Embodiment 5

Here, one example of a reflective optical device having an electromagnetic wave detection unit to detect incidence of an electromagnetic wave is described.

In Embodiment 3, we stated that in the reflective optical device in which the substrate that causes an optical gate effect, a differential current (ΔIph) is generated by photoelectric conversion in the substrate. The electromagnetic wave detection unit detects the differential current (ΔIph).

Figure 19:
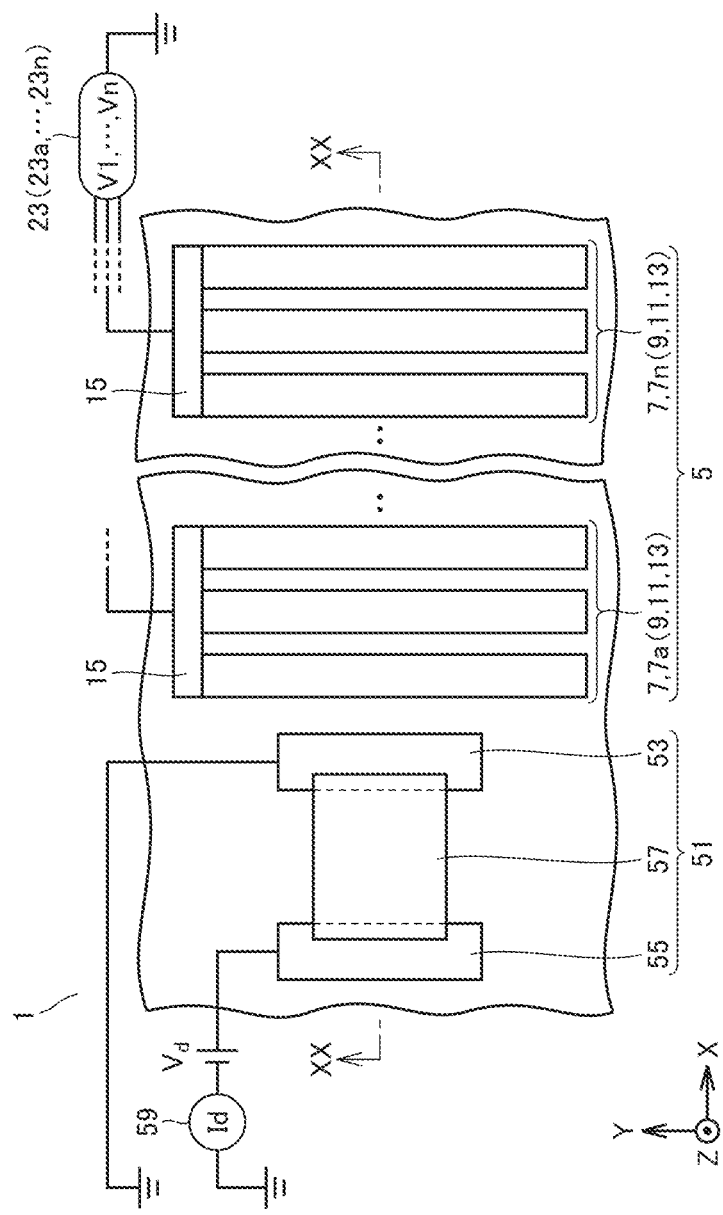
FIG. 19 is a plan view showing one example of a reflective optical device according to Embodiment 5.
Figure 20:
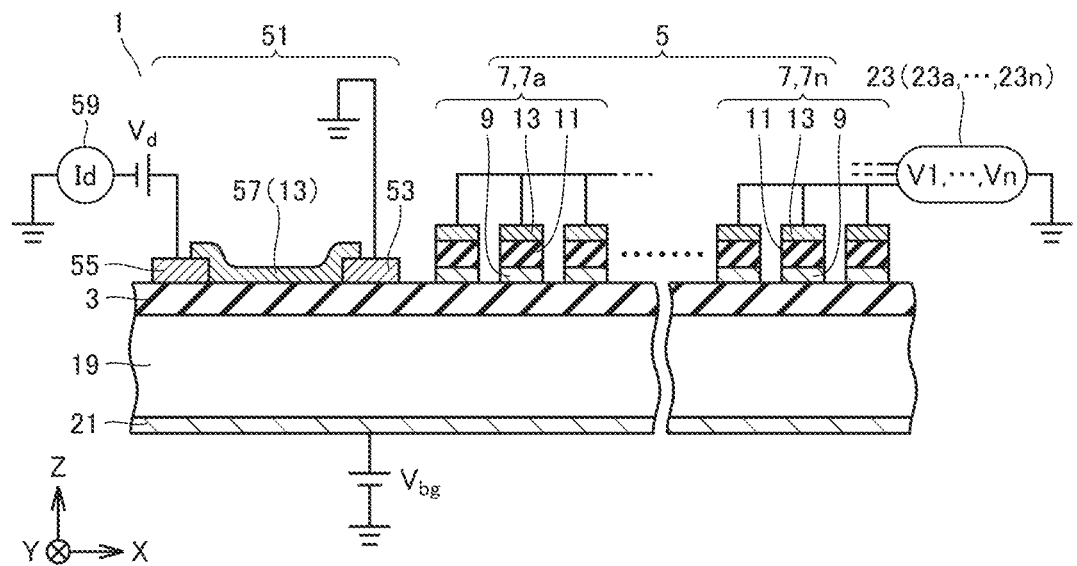
FIG. 20 is a sectional view in a section line XX-XX shown in FIG. 19 in Embodiment 5.

As shown in FIG. 19 and FIG. 20, in reflective optical device 1, an electromagnetic wave detection unit 51 is formed in addition to lattice group 5. Electromagnetic wave detection unit 51 includes source electrode 53 and drain electrode 55 as a first detection electrode and a second detection electrode, and a graphene layer 57. Source electrode 53 and drain electrode 55 are distanced from each other such that they are in contact with insulation layer 3. Graphene layer 57 is interposed between source electrode 53 and drain electrode 55, and in contact with source electrode 53 and drain electrode 55.

Source electrode 53 is electrically connected to the ground potential. To drain electrode 55, a current sensing unit 59 and a bias supply (bias voltage Vd) are electrically connected in series. The remaining configuration is the same as the configuration of the reflective optical device shown FIG. 2 and FIG. 3, and hence the same member is denoted by the same reference sign, and description thereof is omitted unless necessary.

Next, one example of a method for producing above-described reflective optical device 1 is briefly described. Source electrode 53 and drain electrode 55 are formed to be in contact with insulation layer 3. Source electrode 53 and drain electrode 55 are formed, for example, of gold (Au), silver (Ag), copper (Cu), aluminum (Al), nickel (Ni), chromium (Cr), or palladium (Pd).

In order to enhance the adhesion between source electrode 53 and drain electrode 55, and insulation layer 3, an adhesion film (not shown) of, for example, chromium (Cr) or titanium (Ti) may be formed between source electrode 53 and drain electrode 55, and insulation layer 3. The sizes (thickness, dimension) of source electrode 53 and drain electrode 55 are not particularly limited as long as an electric signal can be output.

Next, graphene layer 9 and dielectric layer 11 are laminated to cover source electrode 53 and drain electrode 55. Next, the part of dielectric layer 11 and the part of graphene layer 9 that are located in the region where the electromagnetic wave detection unit is to be formed are removed, so that source electrode 53 and drain electrode 55 are exposed.

Next, graphene layer 13 is formed to cover source electrode 53, drain electrode 55, dielectric layer 11, and so on. Next, electrode 15 is formed on graphene layer 13.

Next, by conducting a photomechanical process and an etching treatment, graphene layer 57 of electromagnetic wave detection unit 51 is patterned. Also, lattice group 5 including plural lattices 7 is formed. In this way, the main part of reflective optical device 1 is completed.

In above-described reflective optical device 1, likewise the description of Embodiment 3, both back gate voltage Vbg applied from reflective plate 21, and the voltage corresponding to the variation in voltage caused by photoelectric conversion accompanying incidence of the electromagnetic wave are applied to graphene layer 57. Therefore, when an electromagnetic wave is applied, the Dirac point voltage shifts from VDP to VDP+Vph (see FIG. 17). Thus, this shift in voltage is sensed as differential current (ΔIph) by current sensing unit 59. As a result, incidence of the electromagnetic wave into reflective optical device 1 can be sensed.

The number of electromagnetic wave detection unit 51 arranged in reflective optical device 1 is not limited to one, and may be two or more. In this case, by arranging electromagnetic wave detection units 51 in array, it is possible to determine the position where the electromagnetic wave is detected. Also, electromagnetic wave detection unit 51 may be used as an image sensor.

Figure 21:
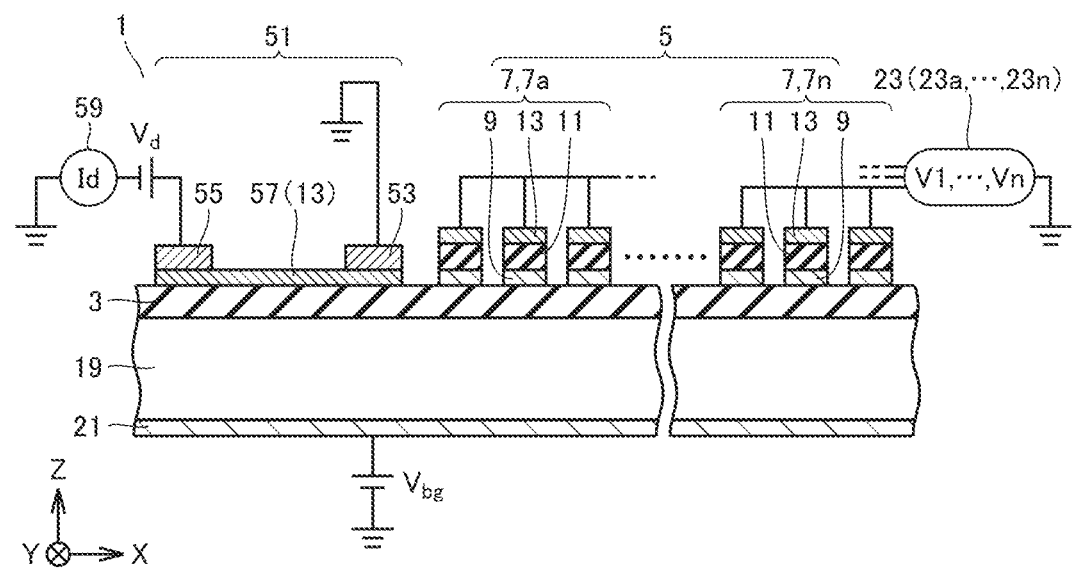
FIG. 21 is a sectional view showing another example of the reflective optical device in Embodiment 5.

Next, one modified example of reflective optical device 1 is described. As shown in FIG. 21, in electromagnetic wave detection unit 51, source electrode 53 and drain electrode 55 are formed on graphene layer 57. Graphene layer 57 is formed of the same layer as graphene layer 13 forming lattice 7. Source electrode 53 and drain electrode 55 are formed of the same layer as electrode 15 (see FIG. 19).

Next, one example of a method for producing this reflective optical device 1 is briefly described. Insulation layer 3 is formed on substrate 19. Graphene layer 9 and dielectric layer 11 are laminated to cover insulation layer 3. Next, the part of dielectric layer 11 and the part of graphene layer 9 that are located in the region where the electromagnetic wave detection unit is to be formed are removed, so that insulation layer 3 is exposed.

Next, graphene layer 13 is formed to cover insulation layer 3 and dielectric layer 11. Next, in the region where lattice group 5 is to be formed, electrode 15 is formed on graphene layer 13. In the region where electromagnetic wave detection unit 51 is to be formed, source electrode 53 and drain electrode 55 are formed.

Next, by conducting a photomechanical process and an etching treatment, lattice group 5 including plural lattices 7 is formed in the region where lattice group 5 is to be formed. In the region where electromagnetic wave detection unit 51 is to be formed, graphene layer 13 is patterned and graphene layer 57 is formed. In this way, the main part of reflective optical device 1 is completed.

Figure 22:
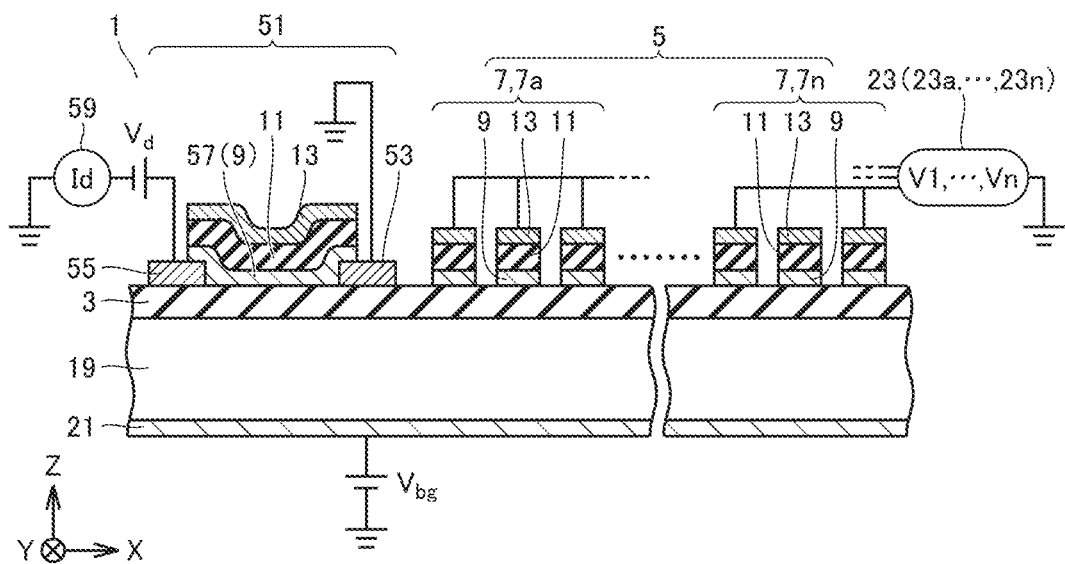
FIG. 22 is a sectional view showing still another example of the reflective optical device in Embodiment 5.

Another modified example of reflective optical device 1 is described. As shown in FIG. 22, in electromagnetic wave detection unit 51, dielectric layer 11 and graphene layer 13 are laminated on graphene layer 57. Graphene layer 57, dielectric layer 11, and graphene layer 13 are respectively formed of the same layers as graphene layer 9, dielectric layer 11, and graphene layer 13 forming lattice 7

Figure 23:
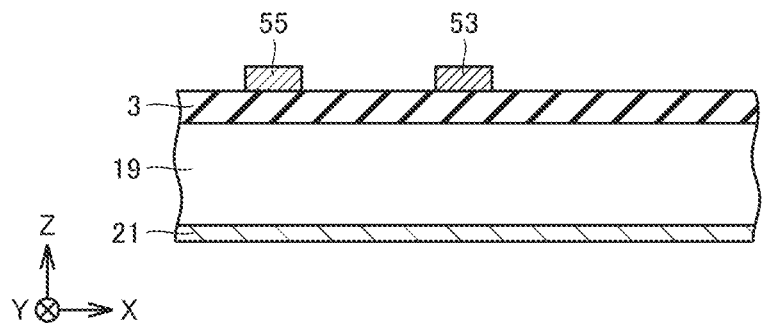
FIG. 23 is a sectional view showing one step of a method for producing the reflective optical device shown in FIG. 22.
Figure 24:
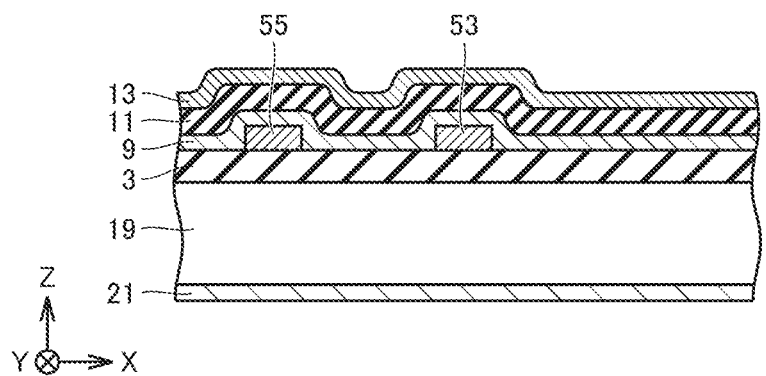
FIG. 24 is a sectional view showing a step conducted after the step shown in FIG. 23.

Next, one example of a method for producing this reflective optical device 1 is briefly described. As shown in FIG. 23, source electrode 53 and drain electrode 55 are formed to be in contact with insulation layer 3. Next, as shown in FIG. 24, graphene layer 9, dielectric layer 11, and graphene layer 13 are sequentially laminated to cover source electrode 53 and drain electrode 55.

Figure 25:
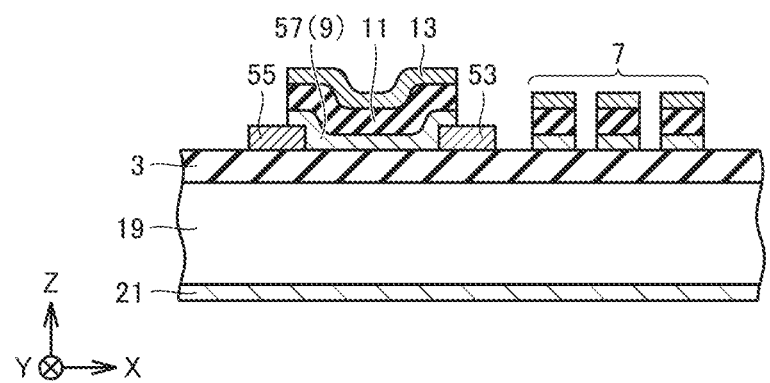
FIG. 25 is a sectional view showing a step conducted after the step shown in FIG. 24.

Next, as shown in FIG. 25, a photomechanical process and an etching treatment are conducted. Thus, in the region where lattice group 5 is to be formed, lattice group 5 including plural lattices 7 is formed. In the region where electromagnetic wave detection unit 51 is to be formed, graphene layer 13, dielectric layer 11, and graphene layer 9 are patterned, and a structure including graphene layer 57 is formed.

Next, an electrode (not shown) and the like are formed to complete the main part of reflective optical device 1. In this reflective optical device 1, graphene layer 13 in electromagnetic wave detection unit 51 is electrically floating. In this production method, electromagnetic wave detection unit 51 can be formed in tandem with the step of forming lattice group 5 except for the step of forming source electrode 53 and drain electrode 55.

Embodiment 6

Figure 26:
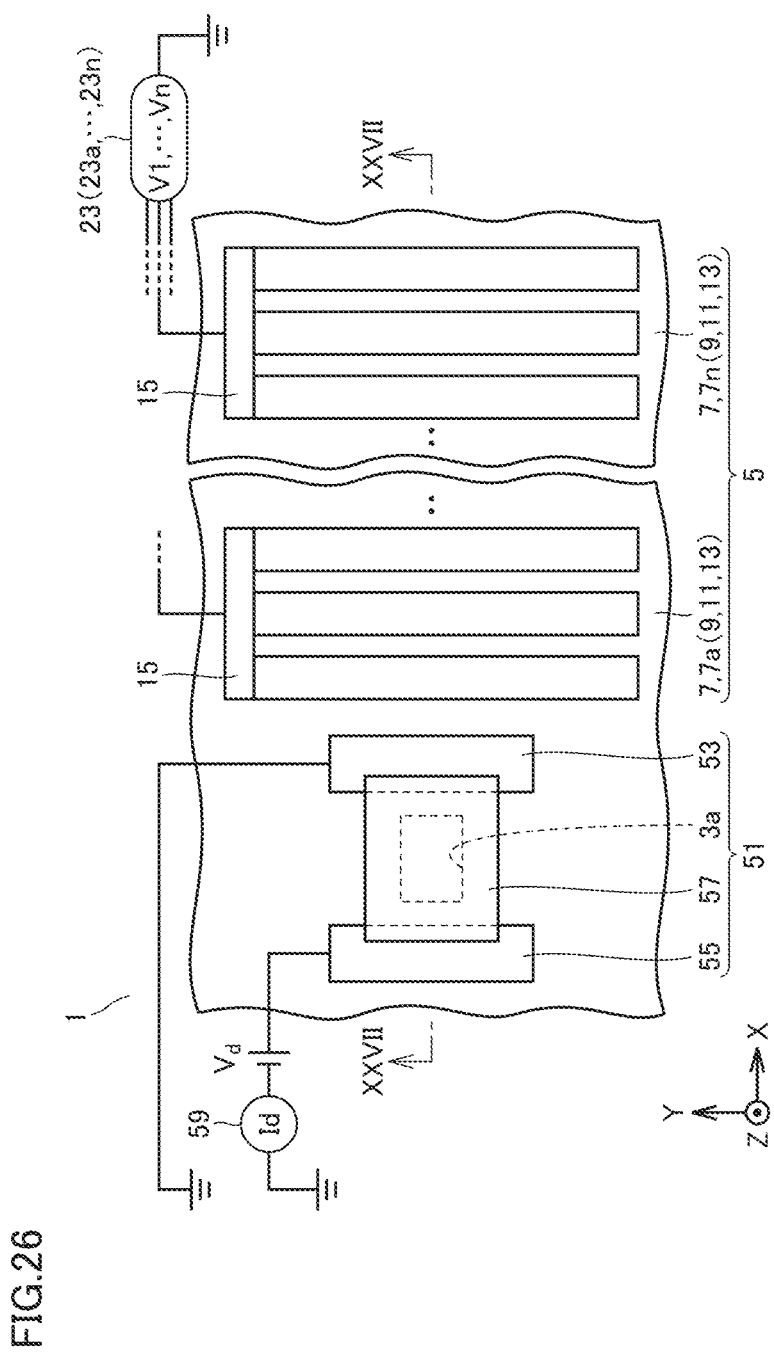
FIG. 26 is a plan view showing one example of a reflective optical device according to Embodiment 6.
Figure 27:
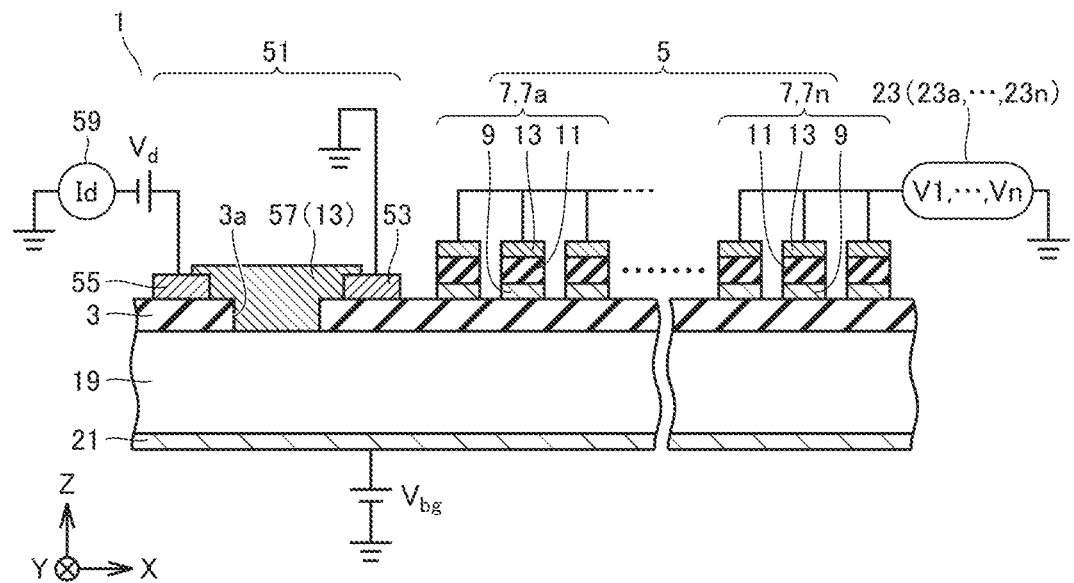
FIG. 27 is a sectional view in a section line XXVII-XXVII shown in FIG. 26 in Embodiment 6.

Here, a reflective optical device having an electromagnetic wave detection unit according to a modified example is described. As shown in FIG. 26 and FIG. 27, in electromagnetic wave detection unit 51 in reflective optical device 1, graphene layer 57 is in contact with substrate 19. In insulation layer 3, an opening 3a is formed. Graphene layer 57 is in contact with substrate 19 via opening 3a. The opening shape of opening 3a is not restricted as long as graphene layer 57 and substrate 19 are in contact with each other.

As a material for substrate 19, for example, silicon is employed. To substrate 19, back gate voltage Vbg is applied. To drain electrode 55, bias voltage Vd is applied. Source electrode 53 is electrically connected to the ground potential. The current flowing between drain electrode 55 and source electrode 53 is sensed by current sensing unit 59.

The remaining configuration is the same as that of reflective optical device 1 shown FIG. 19 and FIG. 20, and hence the same member is denoted by the same reference sign, and description thereof is omitted unless necessary.

Next, operation of electromagnetic wave detection unit 51 in above-described reflective optical device 1 is described. As the electromagnetic wave enters substrate 19, holes and electrons are generated by photoelectric conversion in substrate 19. One (electric charge) of the generated holes or electrons goes toward reflective plate 21, and the other (electric charge) goes toward graphene layer 57. The electric charge (electrons or holes) having gone toward graphene layer 57 is injected into graphene layer 57.

Between drain electrode 55 and source electrode 53, bias voltage Vd is applied. Accordingly, the electric charge generated in substrate 19 that is injected into graphene layer 57 will flow from graphene layer 57 toward drain electrode 55, or flow from graphene layer 57 toward source electrode 53. By sensing the electric charge flowing in graphene layer 57, the electromagnetic wave can be detected.

Next, a reflective optical device according to a modified example is described. In a graphene layer, in the condition that a bias voltage is applied between one side and the other side of the graphene layer, a current flows between one side and the other side of the graphene layer even in the condition that an electromagnetic wave is not applied because of the band structure. Therefore, as shown in the graph when an electromagnetic wave is not applied in FIG. 17, the minimum value of current Id is higher than 0. This current is called a dark current.

Figure 28:
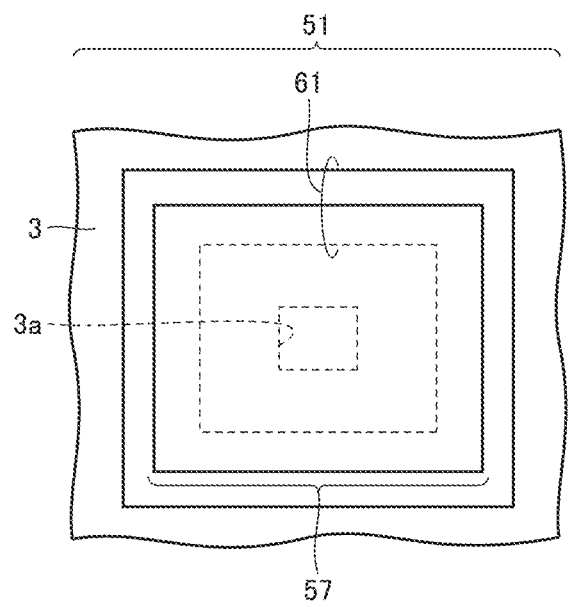
FIG. 28 is a partial plan view showing an electromagnetic wave detection unit in another example of the reflective optical device in Embodiment 6.
Figure 29:
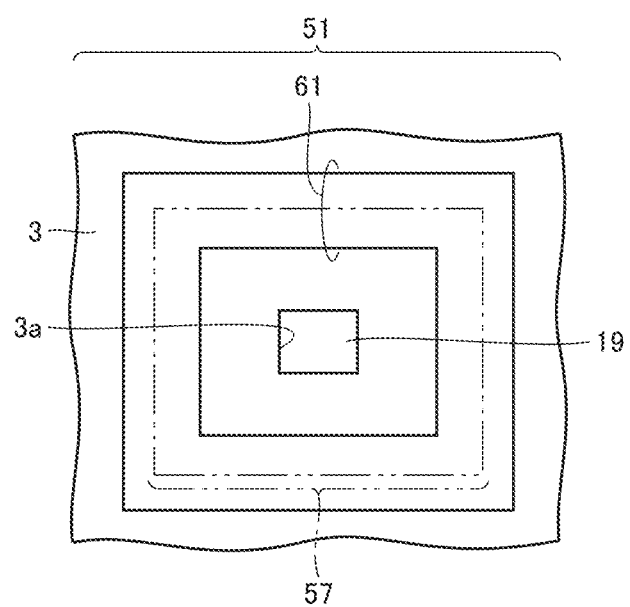
FIG. 29 is an exploded partial plan view of the electromagnetic wave detection unit shown in FIG. 28 in Embodiment 6.

As shown in FIG. 28 and FIG. 29, in electromagnetic wave detection unit 51 of the reflective optical device according to the modified example, an electrode 61 as a first (second) detection electrode is formed to surround opening 3a of insulation layer 3. Graphene layer 57 is formed to be in contact with electrode 61 and charged in opening 3a. Graphene layer 57 that is in contact with electrode 61 is in contact with substrate 19, and substrate 19 is in contact with reflective plate 21.

Therefore, when electric charges (electrons and holes) are generated in substrate 19 by photoelectric conversion, and a current flows between substrate 19 and graphene layer 57, electromagnetic wave detection unit 51 functions as a kind of diode between reflective plate 21 and electrode 61. In electromagnetic wave detection unit 51, a bias voltage is not applied to electrode 61.

Thus, a current will not flow between substrate 19 and graphene layer 57 unless charges (electrons and holes) are generated in substrate 19 by photoelectric conversion. As a result, the dark current can be suppressed, and the noise is suppressed, and thus the detection performance of electromagnetic wave can be improved.

As one example of a material for substrate 19 of above-described reflective optical device 1, silicon was recited. As a material for substrate 19 in which photoelectric conversion occurs, the following materials are recited besides silicon.

Germanium, and compound semiconductors such as III-V group semiconductor or II-V group semiconductor are recited. Also, mercury cadmium telluride (HgCdTe), indium antimonide (InSb), lead selenide (PbSe), lead sulfide (PbS), cadmium sulfide (CdS), gallium nitride (GaN), silicon carbide (SiC), and a topological insulator are recited. Further, a substrate containing a quantum well or a quantum dot is recited. Further, a substrate of a simple substance of materials such as TypeII superlattice or a substrate of combination of such materials is recited.

For example, indium antimonide (InSb) enables photoelectric conversion in an infrared wavelength region. Therefore, in the infrared wavelength region, sensing of an electromagnetic wave by electromagnetic wave detection unit 51 can be conducted with high sensitivity. By varying the material for substrate 19 depending on the wavelength of the electromagnetic wave that is to be reflected, the electromagnetic wave of the specific wavelength can be sensed with high sensitivity.

Embodiment 7

In Embodiment 5 or Embodiment 6, graphene (graphene layer 57) was recited as one example of a material for the two-dimensional material layer applied to electromagnetic wave detection unit 51 in reflective optical device 1. Here, variations of the material for the two-dimensional material layer applied to electromagnetic wave detection unit 51 are described.

As the material for the two-dimensional material layer of the electromagnetic wave detection unit, transition metal dichalcogenide (TMD), black phosphorus, silicene (two-dimensional honeycomb structure by silicon atoms), germanene (two-dimensional honeycomb structure by germanium atoms), and the like materials can be employed. Examples of transition metal dichalcogenide include transition metal dichalcogenides such as $MoS_2$, $WS_2$, and $WSe_2$.

These materials have structures similar to that of graphene, in which atoms can be arranged in a monolayer in a two-dimensional plane. Therefore, also in the case where these materials are employed, the operation and effect equivalent to those with the graphene layer can be obtained.

The material such as transition metal dichalcogenide or black phosphorus has a band gap. Accordingly, the dark current (off-state current) almost disappears, and the noise of the reflective optical device (electromagnetic wave detection unit) can be suppressed. Thus, the sensitivity of detecting an electromagnetic wave improves, and the performance of the reflective optical device can be improved.

In these materials, the size of the band gap can be adjusted by the number of layers of laminating the material. Therefore, the wavelength of the electromagnetic wave to be detected can be selected by the number of layers. For example, transition metal dichalcogenide such as $MoS_2$, $WS_2$, or $WSe_2$ has a band gap corresponding to the wavelength region of visible light. Black phosphorus has a band gap corresponding to the wavelength region of mid infrared rays. Thus, it is possible to obtain a reflective optical device having a wavelength-selective electromagnetic wave detection unit capable of detecting only an electromagnetic wave of a specific wavelength.

By employing these materials, it becomes no longer necessary to control the band gap according to the composition of the semiconductor material as in a conventional semiconductor detector, and it is possible to simplify the production process. Also, there is no need to use an optical filter that is known as a typical wavelength selecting means. Therefore, it is possible to reduce the number of optical components, and reduce the loss in the electromagnetic wave caused by passage of the electromagnetic wave through the optical filter.

With the material such as transition metal dichalcogenide or black phosphorus, it is possible to obtain polarization dependency of electromagnetic wave by providing a laminated structure composed of a plurality of layers, and further controlling the laminating direction. Thus, it is possible to realize a reflective optical device having an electromagnetic wave detection unit to selectively detect only an electromagnetic wave having specific polarization.

Further, different two materials among the materials described above may be combined to form a heterojunction. Also, transition metal dichalcogenide and graphene may be combined to form a heterojunction. Black phosphorus and graphene may be combined to form a heterojunction.

By forming a heterojunction, the same effect as the quantum well effect or the tunnel effect in a conventional semiconductor material can be obtained between the different materials. Thus, the noise of the reflective optical device (electromagnetic wave detection unit) can be suppressed, and recombination can be reduced. As a result, the sensitivity of detecting an electromagnetic wave improves, and the performance of the reflective optical device can be improved.

Especially in the wavelength region of infrared rays where thermal noise is dominant, reduction in thermal noise utilizing the tunnel effect exerts a great effect. Also, a heterojunction enables normal temperature operation. Even with a structure in which a tunnel current does not flow, the effect of suppressing the dark current is generated by laminating graphene and a two-dimensional material. In particular, since graphene is an atomic layer material, by laminating graphene and other two-dimensional material, the effect of suppressing the dark current caused by the result is exerted and the sensitivity of the electromagnetic wave detection unit can be improved.

Also, as a junction, a junction between perovskite and graphene, or a junction between different two-dimensional materials may be used.

The reflective optical devices including an electromagnetic wave detection unit described in the above embodiments may be variously combined as necessary.

Embodiments disclosed herein are merely illustrative, and are not restrictive. The present invention is indicated by the appended claims rather than by the scope described above, and it is intended that all modifications within the equivalent meaning and scope of the claims are included.

INDUSTRIAL APPLICABILITY

The present invention is effectively utilized in a reflective optical device applying a two-dimensional material layer.

REFERENCE SIGNS LIST

1: reflective optical device, 3: insulation layer, 3a: opening, 5: lattice group, 7, 7a, 7i, 7j, 7n: lattice, 9: graphene layer, 11: dielectric layer, 13: graphene layer, 15, 15a, 15i, 15n: electrode, 17: dielectric layer, 19: substrate, 21: reflective plate, 23, 23a, 23i, 23j, 23n: voltage application unit, 31: metal film, 51: electromagnetic wave detection unit, 53: source electrode, 55: drain electrode, 57: graphene layer, 59: current sensing unit, 61: electrode, 71, 71a, 71i, 71j, 71n: electromagnetic wave

The invention claimed is:

1. A reflective optical device that makes a reflection direction of an incoming electromagnetic wave variable, the reflective optical device comprising:
   an insulator having a first surface and a second surface that are opposed to each other;
   a laminated structure part disposed facing the first surface of the insulator;
   an electrode part electrically connected with the laminated structure part, to which a voltage is applied; and
   a reflective plate disposed facing the second surface of the insulator,
   the laminated structure part having a plurality of laminated structures including:
      a plurality of first laminated structures having a first width in a first direction, and extending in a second direction that intersects with the first direction, and
      a plurality of second laminated structures disposed apart from the first laminated structures in the first direction, having a second width in the first direction and extending in the second direction,
   in each of the plurality of laminated structures, a dielectric layer and a first two-dimensional material layer being laminated,
   the electrode part having a plurality of electrodes including:
      a first electrode that is electrically connected with the first two-dimensional material layer in the first laminated structure, to which a first voltage is applied, and
      a second electrode that is electrically connected with the first two-dimensional material layer in the second laminated structure, to which a second voltage is applied,
   each of the first laminated structure and the second laminated structure includes a second two-dimensional material layer,
   the first two-dimensional material layer is laminated on the second two-dimensional material layer with the dielectric layer interposed therebetween,
   the first two-dimensional material layer, the dielectric layer and the second two-dimensional material layer are separated from each other between the plurality of first laminated structures,
   the first two-dimensional material layer, the dielectric layer and the second two-dimensional material layer are separated from each other between the plurality of second laminated structures, a first refractive index of the first two-dimensional material layer in the first laminated structure is varied by the first voltage, a second refractive index of the first two-dimensional material layer in the second laminated structure is varied by the second voltage, and the laminated structure part includes:
- a first lattice which is a first lattice group including the first laminated structure, and
- a second lattice which is a second lattice group including the second laminated structure, wherein between the insulator and the reflective plate, a substrate in which photoelectric conversion is caused by the incoming electromagnetic wave is disposed.

2. The reflective optical device according to claim 1, wherein the first laminated structure and the second laminated structure have a same structure.

3. The reflective optical device according to claim 1, wherein the first lattice includes a plurality of the first laminated structures having the first width in the first direction, and a first length in the second direction and arranged in the first direction at a first pitch, and the second lattice includes a plurality of the second laminated structures having the second width in the first direction, and a second length in the second direction and arranged in the first direction at a second pitch.

4. The reflective optical device according to claim 1, wherein in the first lattice and the second lattice, at least one of a first condition that the first width and the second width are different from each other, a second condition that the first length and the second length are different from each other, a third condition that the first pitch and the second pitch are different from each other, or a fourth condition that a thickness of the dielectric layer in the first lattice and a thickness of the dielectric layer in the second lattice are different from each other is set.

5. The reflective optical device according to claim 3, wherein in the first lattice and the second lattice, the first condition is set.

6. The reflective optical device according to claim 1, wherein letting n be a natural number of greater than or equal to 3, a plurality of the laminated structures include three or more laminated structures from the first laminated structure to an n-th laminated structure including the first laminated structure and the second laminated structure, and a plurality of the electrodes include three or more electrodes from the first electrode to an n-th electrode formed in the three or more laminated structures from the first laminated structure to the n-th laminated structure, including the first electrode and the second electrode.

7. The reflective optical device according to claim 6, wherein the laminated structure part is a lattice group including three or more laminated structures as a plurality of lattices, and letting i and j be natural numbers of greater than or equal to 1 and less than or equal to n that are different from each other, one laminated structure of the three or more laminated structures from the first laminated structure to the n-th laminated structure be an i-th laminated structure, and another laminated structure be a j-th laminated structure, the laminated structure part includes:
- the i-th laminated structure as an i-th lattice; and
- the j-th laminated structure as a j-th lattice, the i-th lattice includes a plurality of the i-th laminated structures having a third width in the first direction, and a third length in the second direction, and arranged in the first direction at a third pitch, and the j-th lattice includes a plurality of the j-th laminated structures having a fourth width in the first direction, and a fourth length in the second direction, and arranged in the first direction at a fourth pitch.

8. The reflective optical device according to claim 7, wherein in the i-th lattice and the j-th lattice, at least one of a fifth condition that the third width and the fourth width are different from each other, a sixth condition that the third length and the fourth length are different from each other, a seventh condition that the third pitch and the fourth pitch are different from each other, or an eighth condition that a thickness of the dielectric layer in the i-th lattice and a thickness of the dielectric layer in the j-th lattice are different from each other is set.

9. The reflective optical device according to claim 1, wherein the laminated structure part is arranged plurally in a one-dimensional form or in a two-dimensional form.

10. The reflective optical device according to claim 1, wherein either of the first two-dimensional material layer and the second two-dimensional material layer is composed of an atomic layer of a monolayer or two or more layers.

11. The reflective optical device according to claim 1, wherein either of the first two-dimensional material layer and the second two-dimensional material layer contains a material selected from the group consisting of graphene, transition metal dichalcogenide, black phosphorus, silicene, graphene nanoribbon, and borophene.

12. The reflective optical device according to claim 1, comprising an electromagnetic wave detection unit to detect the electromagnetic wave, the electromagnetic wave detection unit including:
- a first detection electrode and a second detection electrode formed on the substrate, and
- a third two-dimensional material layer formed to be interposed between the first detection electrode and the second detection electrode.

13. The reflective optical device according to claim 12, wherein the third two-dimensional material layer is in contact with the substrate.

14. The reflective optical device according to claim 12, wherein the electromagnetic wave detection unit is disposed in a plurality of sites in the substrate.

15. The reflective optical device according to claim 1, wherein the laminated structure part is formed in a size shorter than a wavelength of the electromagnetic wave.

16. A reflective optical device that makes a reflection direction of an incoming electromagnetic wave variable, the reflective optical device comprising:
- an insulator having a first surface and a second surface that are opposed to each other;
- a laminated structure part disposed facing the first surface of the insulator;
- an electrode part electrically connected with the laminated structure part, to which a voltage is applied; and
- a reflective plate disposed facing the second surface of the insulator, the laminated structure part having a plurality of laminated structures including:
  a first laminated structure having a first width in a first direction, and extending in a second direction that intersects with the first direction, and
  a second laminated structure disposed apart from the first laminated structure in the first direction, having a second width in the first direction and extending in the second direction,
in each of the plurality of laminated structures, a dielectric layer and a first two-dimensional material layer being laminated,
the electrode part having a plurality of electrodes including:
  a first electrode that is electrically connected with the first two-dimensional material layer in the first laminated structure, to which a first voltage is applied, and
  a second electrode that is electrically connected with the first two-dimensional material layer in the second laminated structure, to which a second voltage is applied,
a first refractive index of the first two-dimensional material layer in the first laminated structure is varied by the first voltage, and
a second refractive index of the first two-dimensional material layer in the second laminated structure is varied by the second voltage, wherein
between the insulator and the reflective plate, a substrate in which photoelectric conversion is caused by the incoming electromagnetic wave is disposed.

17. The reflective optical device according to claim 16, wherein the first two-dimensional material layer contains a material selected from the group consisting of graphene, transition metal dichalcogenide, black phosphorus, silicene, graphene nanoribbon, and borophene.

\* \* \* \* \*